(12) United States Patent
Yamazaki et al.

(10) Patent No.: US 8,975,634 B2
(45) Date of Patent: Mar. 10, 2015

(54) SEMICONDUCTOR DEVICE INCLUDING OXIDE SEMICONDUCTOR FILM

(71) Applicant: Semiconductor Energy Laboratory Co., Ltd., Atsugi-shi, Kanagawa-ken (JP)

(72) Inventors: Shunpei Yamazaki, Setagaya (JP); Motoki Nakashima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 7 days.

(21) Appl. No.: 13/628,466

(22) Filed: Sep. 27, 2012

(65) Prior Publication Data

US 2013/0087782 A1 Apr. 11, 2013

(30) Foreign Application Priority Data

Oct. 7, 2011 (JP) ................................. 2011-223228

(51) Int. Cl.
*H01L 27/108* (2006.01)
*H01L 29/04* (2006.01)
*H01L 29/76* (2006.01)
*H01L 31/036* (2006.01)
(Continued)

(52) U.S. Cl.
CPC .................................. *H01L 29/7869* (2013.01)
USPC ................. 257/69; 257/65; 257/66; 257/347; 257/505; 257/E29.193; 257/21.4

(58) Field of Classification Search
USPC ........... 257/43, 69, 65, 66, 67, 289, 347, 353, 257/505, E29.193, E21.4
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Matthew Reames
*Assistant Examiner* — Dilinh Nguyen
(74) *Attorney, Agent, or Firm* — Eric J. Robinson; Robinson Intellectual Property Law Office, P.C.

(57) ABSTRACT

An object is to suppress occurrence of oxygen deficiency. An oxide semiconductor film is formed using germanium (Ge) instead of part of or all of gallium (Ga) or tin (Sn). At least one of bonds between a germanium (Ge) atom and oxygen (O) atoms has a bond energy higher than at least one of bonds between a tin (Sn) atom and oxygen (O) atoms or a gallium (Ga) atom and oxygen (O) atoms. Thus, a crystal of an oxide semiconductor formed using germanium (Ge) has a low possibility of occurrence of oxygen deficiency. Accordingly, an oxide semiconductor film is formed using germanium (Ge) in order to suppress occurrence of oxygen deficiency.

24 Claims, 17 Drawing Sheets

(51) Int. Cl.
*H01L 31/112* (2006.01)
*H01L 29/12* (2006.01)
*H01L 27/01* (2006.01)
*H01L 27/12* (2006.01)
*H01L 31/0392* (2006.01)
*H01L 29/00* (2006.01)
*H01L 29/786* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,314,420 B2 * | 11/2012 | Hoffman et al. ............... 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0276688 A1 | 11/2010 | Yano et al. |
| 2010/0295041 A1 | 11/2010 | Kumomi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent

(56) References Cited

OTHER PUBLICATIONS

Amorphous Oxide Semiconductor,", IDW '08 : Procedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical Properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irridation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Thecnical Papers, May 31, 2009, pp. 184-187.

Nomura.K et al., "Carrier transport in transparent oxide semiconductor with intrinsic structural randomness probed using single-crystalline InGaO3(ZnO)5 Films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga m=Integer) Described by Four-Dimensional Superspace Group,", Journal of Solid State Chemistry, 1998, vol. 39, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "Worlds's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amourphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amourphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp.1-4.

Kikuchi.H et al., "Polymer-Stabilized Liquid Crystal Blue Phases,", Nature Materials, Sep. 2, 2002, vol. 1, pp. 64-68.

Kimizuka.n. et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Oritam et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem,. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

FIG. 1A
FIG. 1B
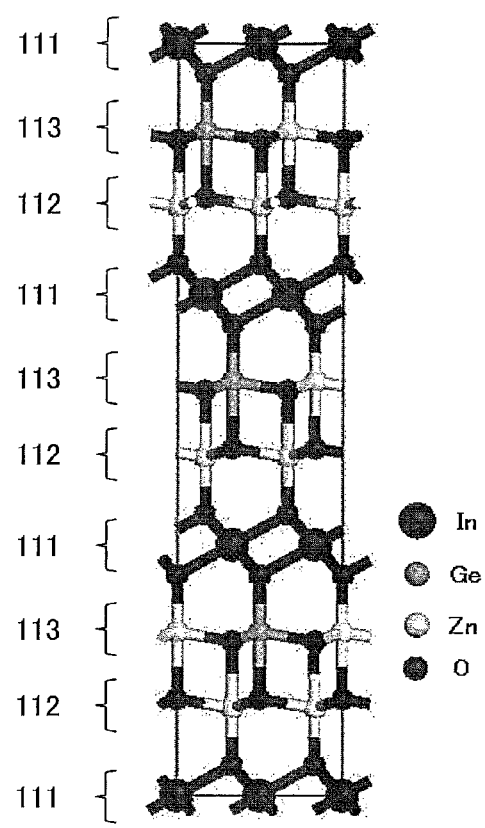
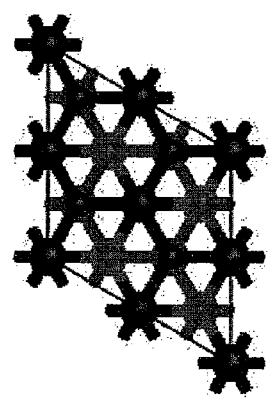

FIG. 2A
FIG. 2B
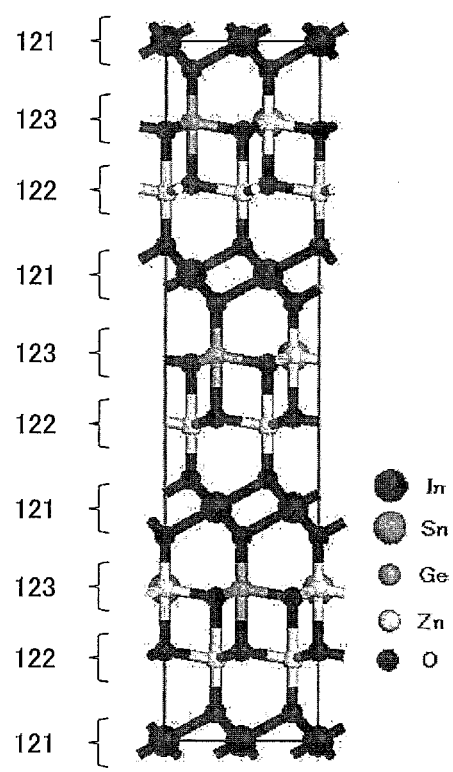
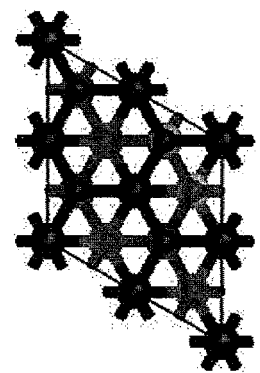

FIG. 3A
FIG. 3B
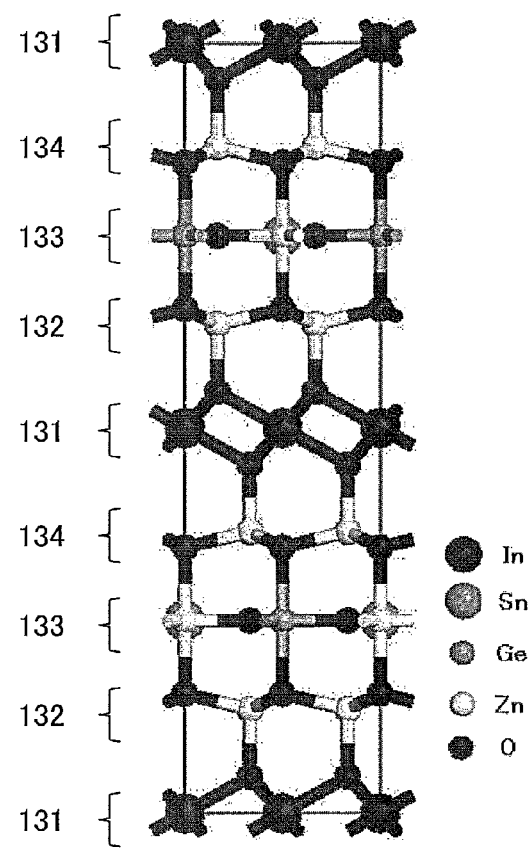
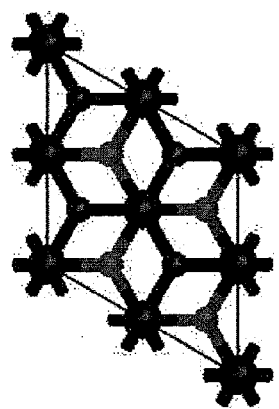

FIG. 4A
FIG. 4B
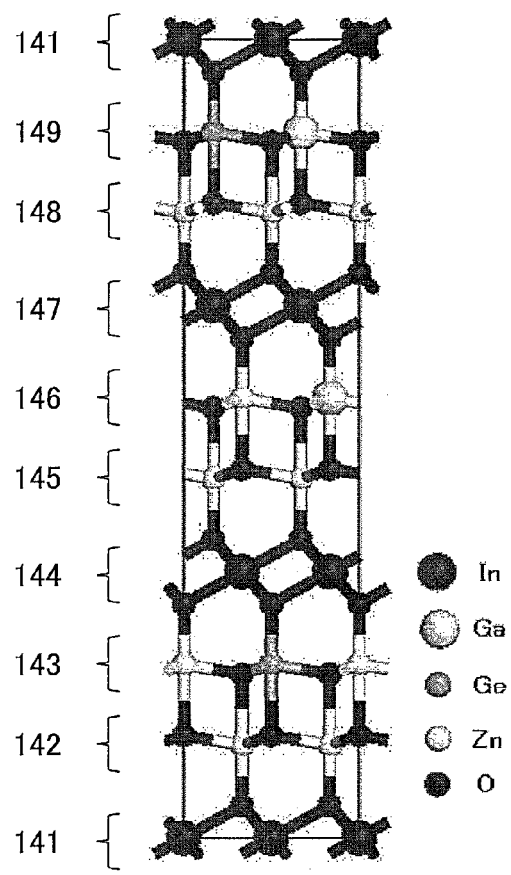
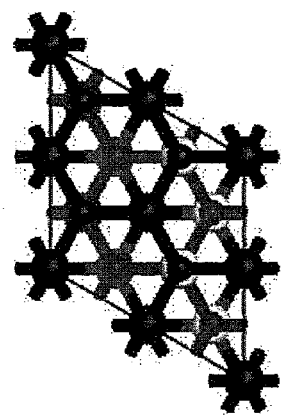

SEMICONDUCTOR DEVICE INCLUDING OXIDE SEMICONDUCTOR FILM

BACKGROUND OF THE INVENTION

1. Field of the Invention

An embodiment of the present invention relates to an oxide semiconductor film. In addition, an embodiment of the present invention relates to a semiconductor device.

It is to be noted that the semiconductor device in this specification refers to all devices that can function by utilizing semiconductor characteristics, and electro-optic devices, semiconductor circuits, and electronic appliances are all semiconductor devices.

2. Description of the Related Art

In recent years, development of semiconductor devices formed using field-effect transistors including oxide semiconductor films has been advanced. The oxide semiconductor film has a function as a layer in which a channel of the field-effect transistor is formed (also referred to as a channel formation layer).

As the field-effect transistor, for example, there are a field-effect transistor in which an oxide semiconductor layer formed with an oxide semiconductor film containing indium (In), gallium (Ga), and zinc (Zn) is used as a channel formation layer, a field-effect transistor in which an oxide semiconductor layer formed with an oxide semiconductor film containing indium (In), tin (Sn), and zinc (Zn) is used as a channel formation layer, and the like (e.g., Patent Document 1).

REFERENCE

Patent Document

[Patent Document 1] Japanese Published Patent Application No. 2006-165528

SUMMARY OF THE INVENTION

However, an oxide semiconductor film used for a field-effect transistor and the like has a problem of occurrence of oxygen deficiency. In addition, when an oxide semiconductor film having an oxygen deficiency is used as a channel formation layer of a field-effect transistor, electrical characteristics of the field-effect transistor are deteriorated; for example, unnecessary carriers are generated in a channel region and off-state current of the field-effect transistor is increased.

An object of an embodiment of the present invention is to suppress occurrence of oxygen deficiency in an oxide semiconductor film. An object of an embodiment of the present invention is to improve electrical characteristics of a field-effect transistor.

In an embodiment of the present invention, an oxide semiconductor film is formed using germanium (Ge) instead of part of or all of gallium (Ga) or tin (Sn). The bond energy between germanium (Ge) and oxygen (O) is higher than the bond energy between gallium (Ga) and oxygen (O) and the bond energy between tin (Sn) and oxygen (O). Thus, a crystal of an oxide semiconductor formed using germanium (Ge) has a low possibility of occurrence of oxygen deficiency. Accordingly, an oxide semiconductor film is formed using germanium (Ge) in order to suppress occurrence of oxygen deficiency.

An embodiment of the present invention is an oxide semiconductor film including a crystal represented by a general formula: $A_x Ge_{(1-x/2)(1-y)} Sn_{(1-x/2)y} Zn_{1-x/2} O_3 (ZnO)_n$ (A is at least one of In, Al, Ce, Nd, and Gd; x is a number greater than 0 and smaller than 2; y is a number greater than or equal to 0 and smaller than 1; and n is a number greater than or equal to 1). For example, when A is In, an oxide semiconductor film includes a crystal represented by a general formula: $In_x Ge_{(1-x/2)(1-y)} Sn_{(1-x/2)y} Zn_{1-x/2} O_3 (ZnO)_n$ (x is a number greater than 0 and smaller than 2, y is a number greater than or equal to 0 and smaller than 1, and n is a number greater than or equal to 1).

Further, an embodiment of the present invention is an oxide semiconductor film including a crystal represented by a general formula: $A_{x(1-y)} Ga_{xy} Ge_{1-x/2} Zn_{1-x/2} O_3 (ZnO)_n$ (A is at least one of In, Al, Ce, Nd, and Gd; x is a number greater than 0 and smaller than 2; y is a number greater than or equal to 0 and smaller than 1; and n is a number greater than or equal to 1). For example, when A is In, an oxide semiconductor film includes a crystal represented by a general formula: $In_{x(1-y)} Ga_{xy} Ge_{1-x/2} Zn_{1-x/2} O_3 (ZnO)_n$ (x is a number greater than 0 and smaller than 2, y is a number greater than or equal to 0 and smaller than 1, and n is a number greater than or equal to 1).

In addition, an embodiment of the present invention is a semiconductor device including an oxide semiconductor layer, an insulating layer, a first conductive layer overlapping with part of the oxide semiconductor layer with the insulating layer provided therebetween, a second conductive layer electrically connected to the oxide semiconductor layer, and a third conductive layer electrically connected to the oxide semiconductor layer. Here, the oxide semiconductor layer is formed using at least part of the oxide semiconductor film and thus includes the same crystal as that of the oxide semiconductor film. In addition, the oxide semiconductor layer has a function as a channel formation layer of a field-effect transistor. The insulating layer has a function as a gate insulating layer of the field-effect transistor. The first conductive layer has a function as a gate of the field-effect transistor. The second conductive layer has a function as one of a source and a drain of the field-effect transistor. The third conductive layer has a function as the other of the source and the drain of the field-effect transistor.

According to an embodiment of the present invention, occurrence of oxygen deficiency in an oxide semiconductor material can be suppressed. The oxide semiconductor material is used for a channel formation layer of a field-effect transistor, so that electrical characteristics of the field-effect transistor can be improved.

BRIEF DESCRIPTION OF THE DRAWINGS

FIGS. 1A and 1B are schematic diagrams illustrating an example of a crystal structure included in an oxide semiconductor film.

FIGS. 2A and 2B are schematic diagrams illustrating an example of a crystal structure included in an oxide semiconductor film.

FIGS. 3A and 3B are schematic diagrams illustrating an example of a crystal structure included in an oxide semiconductor film.

FIGS. 4A and 4B are schematic diagrams illustrating an example of a crystal structure included in an oxide semiconductor film.

DETAILED DESCRIPTION OF THE INVENTION

Figure 5A:
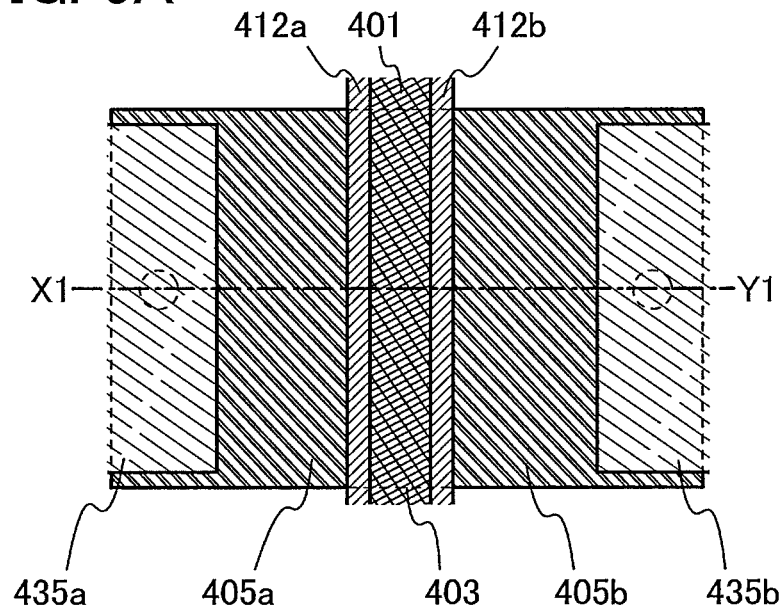
FIGS. 5A and 5B are diagrams illustrating an example of a semiconductor device.

Examples of embodiments for describing the present invention will be explained below with reference to the drawings. Note that it will be readily appreciated by those skilled in the art that details of the embodiments can be modified in various ways without departing from the spirit and scope of the present invention. Thus, the present invention should not be limited to the description of the following embodiments.

Note that the contents in different embodiments can be combined with one another as appropriate. In addition, the details of the embodiments can be replaced with each other.

Further, the ordinal numbers such as "first" and "second" are used to avoid confusion between components and do not limit the number of each component.

Embodiment 1

In this embodiment, an example of an oxide semiconductor film which is an embodiment of the present invention is described.

The oxide semiconductor film of this embodiment includes a crystal. The crystal can be represented by, for example, a general formula: $In_xGe_{(1-x/2)(1-y)}Sn_{(1-x/2)y}Zn_{1-x/2}O_3(ZnO)_n$ (x is a number greater than 0 and smaller than 2, y is a number greater than or equal to 0 and smaller than 1, and n is a number greater than or equal to 1) or a general formula: $In_{x(1-y)}Ga_{x-y}Ge_{1-x/2}Zn_{1-x/2}O_3(ZnO)_n$ (x is a number greater than 0 and smaller than 2, y is a number greater than or equal to 0 and smaller than 1, and n is a number greater than or equal to 1). Note that a value of n is not necessarily limited to an integer and may be a number greater than or equal to 1; however, when n is, for example, an integer greater than or equal to 1 and smaller than or equal to 50, a crystal can be more stabilized. As described above, the oxide semiconductor film of this embodiment includes a crystal containing germanium (Ge). Note that in the above crystal, indium (In) can be replaced with another element (e.g., at least one of Al, Ce, Nd, Gd, and the like).

The crystal represented by the above general formula has a layered structure including a layer containing indium (In), a layer containing germanium (Ge), and a layer containing zinc (Zn). The crystal having the above layered structure becomes a semiconductor with favorable electrical characteristics; for example, the band gap is wider than that of silicon. Note that the stacking sequence of layers of the layered structure may be changed depending on a proportion of indium (In), germanium (Ge), and zinc (Zn). In some cases, another layer containing one or more of indium (In), germanium (Ge), and zinc (Zn) is stacked in addition to the above layers.

Further, the oxide semiconductor film can be formed by a sputtering method over an element formation layer, for example. Here, an oxide target containing the above elements such as indium (In), germanium (Ge), and zinc (Zn) can be used as a sputtering target.

Further, schematic diagrams each illustrating an example of a crystal structure of the oxide semiconductor film of this embodiment are described with reference to FIGS. 1A and 1B, FIGS. 2A and 2B, FIGS. 3A and 3B, and FIGS. 4A and 4B.

A crystal illustrated in FIGS. 1A and 1B is a crystal of an In—Ge—Zn—O oxide semiconductor with a composition ratio of In:Ge:Zn=2:1:3. Note that FIG. 1A is a schematic diagram illustrating a crystal structure in a direction perpendicular to the c-axis. FIG. 1B is a schematic diagram illustrating a crystal structure in a direction perpendicular the a-b plane. A relatively large black sphere represents an indium (In) atom. A relatively small black sphere represents an oxygen (O) atom. A gray sphere represents a germanium (Ge) atom. A white sphere represents a zinc (Zn) atom. Note that for convenience, the size of the spheres may be different from the actual size of the atoms. Further, the coordination number of each atom is not limited to this embodiment.

In the crystal illustrated in FIGS. 1A and 1B, an In layer (a layer containing indium (In)) 111, a Zn layer (a layer containing zinc (Zn)) 112, and a Ge—Zn layer (a layer containing germanium (Ge) and zinc (Zn)) 113 are arranged in this order in a layered manner. That is, the crystal illustrated in FIGS. 1A and 1B has a structure in which a plurality of layers is stacked in the c-axis direction. Note that the stacking sequence of the Zn layer 112 and the Ge—Zn layer 113 is not particularly limited. Further, in FIGS. 1A and 1B, a Ge—Zn layer may be included instead of the Zn layer 112. In addition, a Zn layer may be included instead of the Ge—Zn layer 113.

In the In layer 111, each hexacoordinate indium (In) atom is bonded to six tetracoordinate oxygen (O) atoms.

In the Zn layer 112, each pentacoordinate zinc (Zn) atom is bonded to five tetracoordinate oxygen (O) atoms.

In the Ge—Zn layer 113, each pentacoordinate germanium (Ge) atom is bonded to five tetracoordinate oxygen (O) atoms. Further, each pentacoordinate zinc (Zn) atom is bonded to five tetracoordinate oxygen (O) atoms.

In the case where tin (Sn) is contained in addition to indium (In), germanium (Ge), and zinc (Zn), an oxide semiconductor crystal having the above layered structure can be formed. For example, a crystal illustrated in FIGS. 2A and 2B is a crystal of an In—Ge—Sn—O oxide semiconductor with a composition ratio of In:Ge:Sn:Zn=4:1:1:6. Note that FIG. 2A is a schematic diagram illustrating a crystal structure in a direction perpendicular to the c-axis. FIG. 2B is a schematic diagram illustrating a crystal structure in a direction perpendicular the a-b plane. A relatively large black sphere represents an indium (In) atom. A relatively small black sphere represents an oxygen (O) atom. A relatively large gray sphere represents a tin (Sn) atom. A relatively small gray sphere represents a germanium (Ge) atom. A white sphere represents a zinc (Zn) atom. Note that for convenience, the size of the spheres may be different from the actual size of the atoms.

In the crystal illustrated in FIGS. 2A and 2B, an In layer 121, a Zn layer 122, and a Ge—Sn—Zn layer (a layer containing germanium (Ge), tin (Sn), and zinc (Zn)) 123 are arranged in this order in a layered manner. That is, the crystal illustrated in FIGS. 2A and 2B has a structure in which a plurality of layers is stacked in the c-axis direction. Note that the stacking sequence of the Zn layer 122 and the Ge—Sn—

Zn layer 123 is not particularly limited. Further, in FIGS. 2A and 2B, a Ge—Zn layer, a Sn—Zn layer (a layer containing tin (Sn) and zinc (Zn)), or a Ge—Sn—Zn layer may be included instead of the Zn layer 122. Further, a Ge—Zn layer, a Sn—Zn layer, or a Zn layer may be included instead of the Ge—Sn—Zn layer 123.

In the In layer 121, each hexacoordinate indium (In) atom is bonded to six tetracoordinate oxygen (O) atoms.

In the Zn layer 122, each pentacoordinate zinc (Zn) atom is bonded to five tetracoordinate oxygen (O) atoms.

In the Ge—Sn—Zn layer 123, each pentacoordinate germanium (Ge) atom is bonded to five tetracoordinate oxygen (O) atoms. Further, each pentacoordinate tin (Sn) atom is bonded to five tetracoordinate oxygen (O) atoms. Further, each pentacoordinate zinc (Zn) atom is bonded to five tetracoordinate oxygen (O) atoms.

In the case where tin (Sn) is contained in addition to indium (In), germanium (Ge), and zinc (Zn) as illustrated in FIGS. 2A and 2B, an oxide semiconductor crystal having the above layered structure can be formed. For example, carrier mobility can be increased by addition of tin (Sn).

In the case where the proportion of the crystal illustrated in FIGS. 2A and 2B of indium (In), germanium (Ge), tin (Sn), and zinc (Zn) is changed, an oxide semiconductor crystal having the above layered structure can be formed. For example, a crystal illustrated in FIGS. 3A and 3B is a crystal of an In—Ge—Sn—Zn—O oxide semiconductor with a composition ratio of In:Ge:Sn:Zn=4:1:1:10. Note that FIG. 3A is a schematic diagram illustrating a crystal structure in a direction perpendicular to the c-axis. FIG. 3B is a schematic diagram illustrating a crystal structure in a direction perpendicular to the a-b plane. A relatively large black sphere represents an indium (In) atom. A relatively small black sphere represents an oxygen (O) atom. A relatively large gray sphere represents a tin (Sn) atom. A relatively small gray sphere represents a germanium (Ge) atom. A white sphere represents a zinc (Zn) atom. Note that for convenience the size of the spheres may be different from the actual size of the atoms.

In the crystal illustrated in FIGS. 3A and 3B, an In layer 131, a Zn layer 132, a Ge—Sn—Zn layer 133, and a Zn layer 134 are arranged in a layered manner in this order. That is, the crystal illustrated in FIGS. 3A and 3B has a structure in which a plurality of layers is stacked in the c-axis direction. Note that the stacking sequence of the Zn layer 132, the Ge—Sn—Zn layer 133, and the Zn layer 134 is not particularly limited. Further, in FIGS. 3A and 3B, a Ge—Zn layer, a Sn—Zn layer, or a Ge—Sn—Zn layer may be included instead of the Zn layer 132. A Ge—Zn layer, a Sn—Zn layer, or a Zn layer may be included instead of the Ge—Sn—Zn layer 133. A Ge—Zn layer, a Sn—Zn layer, or a Ge—Sn—Zn layer may be included instead of the Zn layer 134.

In the In layer 131, each hexacoordinate indium (In) atom is bonded to six tetracoordinate oxygen (O) atoms.

In the Zn layer 132, each pentacoordinate zinc (Zn) atom is bonded to five tetracoordinate oxygen (O) atoms.

In the Ge—Sn—Zn layer 133, each pentacoordinate germanium (Ge) atom is bonded to five tetracoordinate oxygen (O) atoms. Further, each pentacoordinate tin (Sn) atom is bonded to five tetracoordinate oxygen (O) atoms. Further, each pentacoordinate zinc (Zn) atom is bonded to five tetracoordinate oxygen (O) atoms.

In the Zn layer 134, each pentacoordinate zinc (Zn) atom is bonded to five tetracoordinate oxygen (O) atoms.

Even in the case where the proportion of indium (In), germanium (Ge), tin (Sn), and zinc (Zn) is changed as illustrated in FIGS. 3A and 3B, a crystal of an oxide semiconductor can be formed. For example, carrier mobility can be increased by increasing the amount of indium (In). Further, when the amount of zinc (Zn) is increased, the oxide semiconductor film can be more easily crystallized.

In the case where gallium (Ga) is contained in addition to indium (In), germanium (Ge), and zinc (Zn), an oxide semiconductor crystal having the above layered structure can be formed. For example, a crystal illustrated in FIGS. 4A and 4B is a crystal of an In—Ga—Ge—Zn—O oxide semiconductor with a composition ratio of In:Ga:Ge:Zn=3:1:1:4. Note that FIG. 4A is a schematic diagram illustrating a crystal structure in a direction perpendicular to the c-axis. FIG. 4B is a schematic diagram illustrating a crystal structure in a direction perpendicular to the a-b plane. A relatively large black sphere represents an indium (In) atom. A relatively small black sphere represents an oxygen (O) atom. A gray sphere represents a germanium (Ge) atom. A relatively large white sphere represents a gallium (Ga) atom. A relatively small white sphere represents a zinc (Zn) atom. Note that for convenience, the size of the spheres may be different from the actual size of the atoms.

In the crystal illustrated in FIGS. 4A and 4B, an In layer 141, a Zn layer 142, a Ge—Zn layer 143, an In layer 144, a Zn layer 145, a Ga—Zn layer (a layer containing gallium (Ga) and zinc (Zn)) 146, an In layer 147, a Zn layer 148, and a Ga—Ge layer (a layer containing gallium (Ga) and germanium (Ge)) 149 are arranged in a layered manner in this order. That is, the crystal illustrated in FIGS. 4A and 4B has a structure in which a plurality of layers is stacked in the c-axis direction. Note that the stacking sequence of the Zn layer 142 and the Ge—Zn layer 143 is not particularly limited. The stacking sequence of the Zn layer 145 and the Ga—Zn layer 146 is not particularly limited. The stacking sequence of the Zn layer 148 and the Ga—Zn layer 149 is not particularly limited. In FIGS. 4A and 4B, a Ge—Zn layer, a Ga—Zn layer, or a Ga—Ge—Zn layer (a layer containing gallium (Ga), germanium (Ge), and zinc (Zn)) may be included instead of the Zn layer 142. Further, a Ga—Ge—Zn layer, a Ge—Zn layer, or a Zn layer may be included instead of the Ge—Zn layer 143. A Ge—Zn layer, a Ga—Zn layer, or a Ga—Ge—Zn layer may be included instead of the Zn layer 145. A Ga—Ge—Zn layer, a Ge—Zn layer, or a Zn layer may be included instead of the Ga—Zn layer 146. In addition, a Ge—Zn layer, a Ga—Zn layer, or a Ga—Ge—Zn layer may be included instead of the Zn layer 148. A Ga—Ge—Zn layer, a Ge layer (a layer containing germanium (Ge)), or a Ga layer (a layer containing gallium (Ga)) may be included instead of the Ga—Ge layer 149.

In the In layer 141, each hexacoordinate indium (In) atom is bonded to six tetracoordinate oxygen (O) atoms.

In the Zn layer 142, each pentacoordinate zinc (Zn) atom is bonded to five tetracoordinate oxygen (O) atoms.

In the Ge—Zn layer 143, each pentacoordinate germanium (Ge) atom is bonded to five pentacoordinate oxygen (O) atoms. Each pentacoordinate zinc (Zn) atom is bonded to five tetracoordinate oxygen (O) atoms.

In the In layer 144, each hexacoordinate indium (In) atom is bonded to six tetracoordinate oxygen (O) atoms.

In the Zn layer 145, each pentacoordinate zinc (Zn) atom is bonded to five tetracoordinate oxygen (O) atoms.

In the Ga—Zn layer 146, each pentacoordinate gallium (Ga) atom is bonded to five tetracoordinate oxygen (O) atoms. Further, each pentacoordinate zinc (Zn) atom is bonded to five tetracoordinate oxygen (O) atoms.

In the In layer 147, each hexacoordinate indium (In) atom is bonded to six tetracoordinate oxygen (O) atoms.

In the Zn layer 148, each pentacoordinate zinc (Zn) atom is bonded to five tetracoordinate oxygen (O) atoms.

In the Ga—Ge layer 149, each pentacoordinate gallium (Ga) atom is bonded to five tetracoordinate oxygen (O) atoms. Further, each pentacoordinate germanium (Ge) atom is bonded to five tetracoordinate oxygen (O) atoms.

In the case where gallium (Ga) is used instead of tin (Sn) as illustrated in FIGS. 4A and 4B, an oxide semiconductor crystal having the above layered structure can be formed.

In addition, as the oxide semiconductor film, a c-axis aligned crystalline oxide semiconductor (CAAC-OS) film may be used.

CAAC-OS is a mixed phase structure of a crystal portion and an amorphous portion. Further, in the crystal included in the crystal portion, a c-axis is aligned in a direction perpendicular to a surface where the semiconductor film is formed or a surface of the semiconductor film, triangular or hexagonal atomic arrangement which is seen from the direction perpendicular to the a-b plane is formed, and layers each containing metal atoms and oxygen atoms are stacked in a layered manner. The normal vectors of the layers are aligned in the c-axis direction. Therefore, the CAAC-OS is not completely single crystal nor completely amorphous. Note that when the CAAC-OS includes a plurality of crystal portions, the directions of the a-axes and the b-axes of crystals of the plurality of crystal portions may be different from each other. Note that the crystal portion includes the crystal having any of the structures described with reference to FIGS. 1A and 1B, FIGS. 2A and 2B, FIGS. 3A and 3B, and FIGS. 4A and 4B.

Note that in most cases, the crystal portion of CAAC-OS fits inside a cube whose one side is less than 100 nm. From an observation image obtained with a transmission electron microscope (also referred to as TEM), a boundary between a crystal portion and an amorphous portion in the CAAC-OS is not always clear. Further, a grain boundary in the CAAC-OS is not found. Thus, in the CAAC-OS, a reduction in electron mobility, due to the grain boundary, is prevented.

Further, in the CAAC-OS film, distribution of crystal portions is not necessarily uniform in the depth direction of the film. For example, when a crystal growth occurs from a surface side of the oxide semiconductor film to form the CAAC-OS film, in some cases, the proportion of the crystal portions in the vicinity of the surface of the CAAC-OS film is high and the proportion of the amorphous portions in the vicinity of the surface where the CAAC-OS film is formed is high.

The c-axes of the crystal included in the crystal portion of the CAAC-OS are perpendicular to the surface where the CAAC-OS film is formed or the surface of the CAAC-OS film; thus, the directions of the c-axes may be different from each other depending on the shape of the CAAC-OS film (the cross-sectional shape of the surface where the CAAC-OS film is formed or the cross-sectional shape of the surface of the CAAC-OS film). Note that the c-axes in the crystal portions of the CAAC-OS are substantially perpendicular to the surface where the CAAC-OS film is formed or the surface of the CAAC-OS film.

The above is descriptions of the examples of the crystal structure of an oxide semiconductor illustrated in FIGS. 1A and 1B, FIGS. 2A and 2B, FIGS. 3A and 3B, and FIGS. 4A and 4B.

Further, in order to examine which element tin (Sn), gallium (Ga), or germanium (Ge) has the strongest bond with oxygen (O), a value of an energy which is necessary for oxide of each of tin (Sn), gallium (Ga), and germanium (Ge) to form an oxygen-deficient state (such an energy is also referred to as deficiency formation energy $E_{def}$) and a value of the bond energy between a metal and oxygen (O) are described by using Table 1.

TABLE 1

| Material | Deficiency Formation Energy [eV] | Coordination Number of O | Bond Energy per Bond [eV] |
|---|---|---|---|
| $Ga_2O_3$ | 4.17 | 3 | 1.39 |
| $SnO_2$ | 3.51 | 3 | 1.17 |
| $GeO_2$ having Rutile Structure | 4.33 | 3 | 1.44 |
| $GeO_2$ having Quartz Structure | 3.08 | 2 | 1.54 |

The deficiency formation energy $E_{def}$ is expressed by the formula below.

$$E_{def}=(E(A_M O_{N-1})+E(O))-E(A_M O_N)$$

Here, A denotes any of tin (Sn), gallium (Ga), and germanium (Ge). Note that E(O) denotes total energy possessed by an oxygen (O) atom, $E(A_M O_N)$ denotes energy of metal oxide $A_M O_N$ having no oxygen deficiency, and $E(A_M O_{N-1})$ denotes energy of metal oxide $A_M O_{N-1}$ having an oxygen deficiency. M and N each denote the number of atoms. The sum of M and N is the number of atoms used for calculation.

The larger the value of the deficiency formation energy $E_{def}$ is, the more energy is needed to form an oxygen-deficient state, which means that bond with oxygen (O) tends to be strong.

For the calculation of the deficiency formation energy $E_{def}$, CASTEP, which is a calculation program for a density functional theory, can be used. In the calculation relating to Table 1, a plane-wave-basis pseudopotential method is used as the density functional theory, and GGA-PBE is used for a functional. The cut-off energy is 500 eV. A 2×2×3 k-point grid, a 3×3×3 k-point grid, a 3×3×2 k-point grid, and a 1×3×3 k-point grid are used for $SnO_2$, $GeO_2$ having a rutile structure, $GeO_2$ having a quartz structure, and $Ga_2O_3$, respectively. In addition, a rutile structure with 48 atoms is used for $SnO_2$, a β-Gallia structure with 80 atoms is used for $Ga_2O_3$, and a rutile structure with 72 atoms and a quartz structure with 72 atoms are used for $GeO_2$. E(O) is a value obtained by dividing energy possessed by oxygen molecules by 2.

Further, a value of the above deficiency formation energy $E_{def}$ is divided by the coordination number of an oxygen (O) atom, whereby a bond energy per bond between a metal atom and an oxygen (O) atom can be obtained.

As shown in Table 1, at least one of bonds between a germanium (Ge) atom and oxygen (O) atoms has a bond energy higher than at least one of bonds between a tin (Sn) atom and oxygen (O) atoms or a gallium (Ga) atom and oxygen (O) atoms. The larger the bond energy is, the less oxygen deficiency occurs. It is thus found that an oxide of germanium (Ge) has a stronger bond with oxygen (O) than an oxide of tin (Sn) and an oxide of gallium (Ga), and that oxygen deficiency hardly occurs in an oxide of germanium (Ge).

Further, values of band-gap energy (obtained by calculation) of an oxide semiconductor film including a crystal containing germanium (Ge) (an In—Ge—Zn—O oxide semiconductor crystal and an In—Ge—Sn—Zn—O oxide semiconductor crystal) and an In—Sn—Zn—O oxide semiconductor crystal (a comparative example) are described with reference to Table 2.

TABLE 2

| Material | Band-gap Energy [eV] |
| --- | --- |
| In—Ge—Zn—O | 0.968 |
| In—Ge—Sn—Zn—O | 0.836 |
| In—Sn—Zn—O | 0.759 |

Note that in the calculation relating to the band-gap energy shown in Table 2, band-gap energy is calculated as follows: a structure is optimized by first principles calculation using plane-wave-basis pseudopotential method based on a density functional theory, and the density of energy states of the crystal structure optimized by the first principles calculation is calculated. Here, first principle calculation software, CASTEP, is used for a calculation program. GGA-PBE is used for a functional. Ultrasoft is used for pseudopotential. The cut-off energy is 380 eV. A 4×4×1 k-point grid and a 5×5×3 k-point grid are used in the structure optimization and the calculation of density of energy states, respectively. In addition, each structure of an In—Ge—Zn—O oxide semiconductor crystal, an In—Sn—Zn—O oxide semiconductor crystal, and an In—Ge—Sn—Zn—O oxide semiconductor crystal is determined on the basis of a structure of an In—Ga—Zn—O oxide semiconductor crystal. Here, as a basic crystal structure of an In—Ga—Zn—O oxide semiconductor, a structure with 84 atoms, which is obtained by doubling the a-axis and the b-axis in the symmetry R-3 (space group number: 148) structure, is used. Further, the structure of an In—Ge—Zn—O oxide semiconductor crystal is a structure in which Ga of the In—Ga—Zn—O oxide semiconductor crystal is replaced so that the ratio of Ge:Zn becomes 1:1. Further, the structure of an In—Sn—Zn—O oxide semiconductor crystal is a structure in which Ga of the In—Ga—Zn—O oxide semiconductor crystal is replaced so that the ratio of Sn:Zn becomes 1:1. Further, the structure of an In—Ge—Sn—Zn—O oxide semiconductor crystal is a structure in which a half of Ge of the In—Ge—Zn—O oxide semiconductor crystal is replaced with Sn. Since each optimized crystal structure has band gap, each structure has the density of energy states equivalent to that of an insulator or a semiconductor. Thus, band-gap energy can be calculated from the density of energy states. Note that, in density functional theory, the band-gap energy may be estimated to be smaller, in some cases.

As shown in Table 2, band-gap energy of an oxide semiconductor film including a crystal containing germanium (Ge) is larger than that of an oxide semiconductor film including a crystal not containing germanium (Ge). That is, band gap of an oxide semiconductor film including a crystal containing germanium (Ge) is wider than that of an oxide semiconductor film including a crystal not containing germanium (Ge).

The above is the description of the example of the oxide semiconductor film in this embodiment.

As described by using FIGS. 1A and 1B, FIGS. 2A and 2B, FIGS. 3A and 3B, and FIGS. 4A and 4B, germanium (Ge) is used in the example of an oxide semiconductor film of this embodiment. Since at least one of bonds between a germanium (Ge) atom and oxygen (O) atoms has a bond energy higher than at least one bond between atoms of another element (e.g., tin (Sn) or gallium (Ga)) and an oxygen (O) atom, occurrence of oxygen deficiency can be suppressed with the use of germanium (Ge).

In addition, since germanium (Ge) is used in the example of an oxide semiconductor film of this embodiment, the band gap can be increased.

Embodiment 2

In this embodiment, an embodiment of a semiconductor device and a method for manufacturing the semiconductor device will be described with reference to FIGS. 5A and 5B, FIGS. 6A and 6B, FIGS. 7A to 7D, and FIGS. 8A to 8C.

The semiconductor device in this embodiment includes the oxide semiconductor film described in Embodiment 1. The semiconductor device includes an oxide semiconductor layer having a function as a channel formation layer of a field-effect transistor, an insulating layer having a function as a gate insulating layer of the field-effect transistor, a first conductive layer overlapping with part of the oxide semiconductor layer with the insulating layer provided therebetween and having a function as a gate of the field-effect transistor, a second conductive layer electrically connected to the oxide semiconductor layer and having a function as one of a source and a drain of the field-effect transistor, and a third conductive layer electrically connected to the oxide semiconductor layer and having a function as the other of the source and the drain of the field-effect transistor.

Figure 5B:
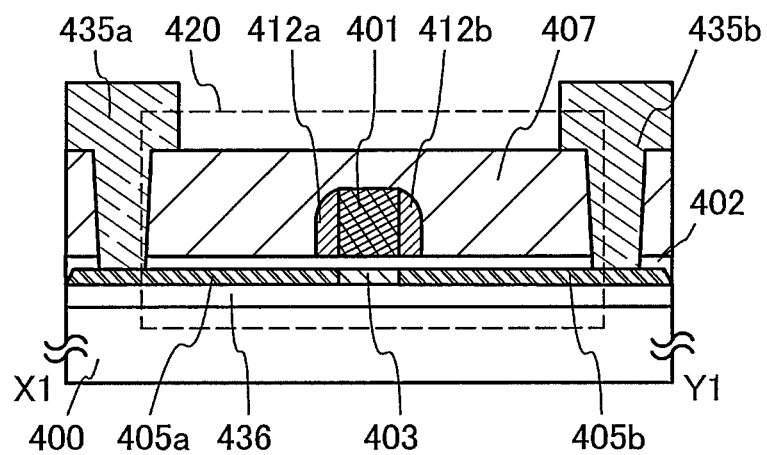

An example of the semiconductor device in this embodiment is illustrated in FIGS. 5A and 5B. FIG. 5A is a plan view of the semiconductor device. FIG. 5B is a cross-sectional view taken along a line X1-Y1 of FIG. 5A. Note that in FIG. 5A, some components of a field-effect transistor 420 (e.g., an insulating layer 407) are not illustrated for simplicity.

The field-effect transistor 420 illustrated in FIGS. 5A and 5B includes, over a substrate 400 having an insulating surface, a base insulating layer 436, a source electrode layer 405a and a drain electrode layer 405b, an oxide semiconductor layer 403 in contact with the source electrode layer 405a on one side surface in the channel length direction and in contact with the drain electrode layer 405b on the other side surface in the channel length direction, a gate insulating layer 402 in contact with top surfaces of the oxide semiconductor layer 403, the source electrode layer 405a, and the drain electrode layer 405b, a gate electrode layer 401 provided over the oxide semiconductor layer 403 with the gate insulating layer 402 provided therebetween, a sidewall layer 412a in contact with one side surface of the gate electrode layer 401 in the channel length direction, and a sidewall layer 412b in contact with the other side surface of the gate electrode layer 401 in the channel length direction.

In the field-effect transistor 420, at least part of the sidewall layer 412a is provided over the source electrode layer 405a with the gate insulating layer 402 provided therebetween. At least part of the sidewall layer 412b is provided over the drain electrode layer 405b with the gate insulating layer 402 provided therebetween. The sidewall layer 412a and the sidewall layer 412b include a conductive material and can serve as part of the gate electrode layer 401; thus, a region where the sidewall layer 412a overlaps with the source electrode layer 405a with the gate insulating layer 402 provided therebetween and a region where the sidewall layer 412b overlaps with the drain electrode layer 405b with the gate insulating layer 402 provided therebetween can be substantially $L_{ov}$ regions.

In addition, the field-effect transistor 420 illustrated in FIGS. 5A and 5B may include, as its components, the insulating layer 407 provided over the sidewall layer 412a, the sidewall layer 412b, and the gate electrode layer 401; and a wiring layer 435a and a wiring layer 435b provided over the insulating layer 407. The wiring layer 435a is electrically connected to the source electrode layer 405a through an opening provided in the insulating layer 407 and the gate insulating layer 402. The wiring layer 435b is electrically connected to the drain electrode layer 405b through an opening provided in the insulating layer 407 and the gate insulating layer 402.

In the case where a sidewall layer including a conductive material is not provided in the field-effect transistor 420, an oxide semiconductor layer and a gate electrode layer each of which has a narrow line width need to be precisely aligned in order to form an $L_{ov}$ region. Further, miniaturization of the field-effect transistor increases the need. However, since the field-effect transistor 420 described in this embodiment includes the sidewall layer 412a and the sidewall layer 412b including a conductive material on the side surfaces of the gate electrode layer 401 in the channel length direction, the region where the sidewall layer 412a overlaps with the source electrode layer 405a and the region where the sidewall layer 412b overlaps with the drain electrode layer 405a can substantially serve as $L_{ov}$ regions. Thus, the degree of freedom of alignment in forming the gate electrode layer 401 can be increased and the field-effect transistor 420 in which a reduction in on-state current is prevented can be provided with high yield.

Further, the oxide semiconductor layer 403 can be formed using the oxide semiconductor film described in Embodiment 1. The oxide semiconductor layer 403 may be formed using a CAAC-OS film.

Figure 6A:
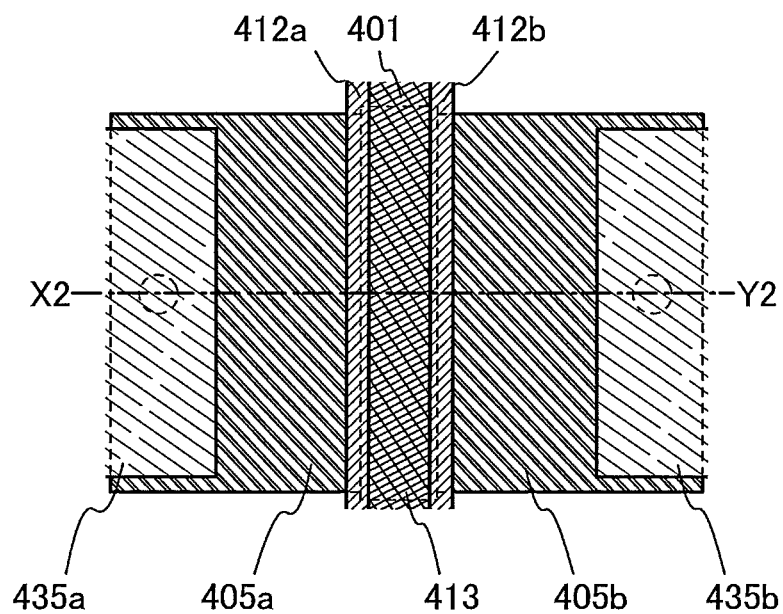
FIGS. 6A and 6B are diagrams illustrating an example of a semiconductor device.
Figure 6B:
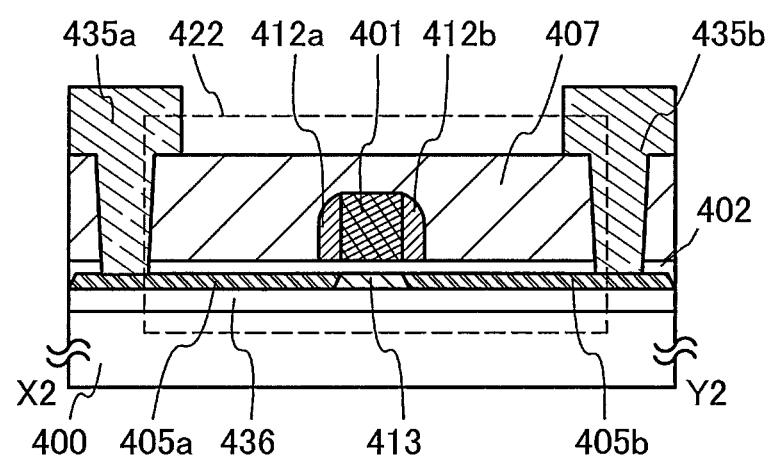

FIGS. 6A and 6B are a plan view and a cross-sectional view illustrating a field-effect transistor 422 having a structure different from the structure of the filed-effect transistor 420 illustrated in FIGS. 5A and 5B. FIG. 6A is a plan view of the field-effect transistor 422. FIG. 6B is a cross-sectional view taken along a line X2-Y2 in FIG. 6A. Note that in FIG. 6A, some components of the field-effect transistor 422 (e.g., the insulating layer 407) are not illustrated for simplicity.

A difference between the field-effect transistor 422 illustrated in FIGS. 6A and 6B and the field-effect transistor 420 illustrated in FIGS. 5A and 5B is the shape of the side surface of the oxide semiconductor layer 403. In the field-effect transistor 422 illustrated in FIGS. 6A and 6B, the side surface of the oxide semiconductor layer 403 which is in contact with the source electrode layer 405a or the drain electrode layer 405b is tapered. When the side surface of the oxide semiconductor layer 403 is tapered, coverage with a conductive film which is to be the source electrode layer 405a and the drain electrode layer 405b can be improved.

An example of a manufacturing process of the field-effect transistor of this embodiment is described below with reference to FIGS. 7A to 7D and FIGS. 8A to 8C. Note that a manufacturing process of the field-effect transistor 422 is described below as an example.

First, the base insulating layer 436 is formed over the substrate 400 having an insulating surface.

There is no particular limitation on a substrate that can be used as the substrate 400 having an insulating surface as long as it has at least heat resistance to withstand a subsequent heat treatment step. For example, a glass substrate of barium borosilicate glass, aluminoborosilicate glass, or the like, a ceramic substrate, a quartz substrate, a sapphire substrate, or a plastic substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate in which a semiconductor element is provided in an upper portion can be used as the substrate 400.

As the substrate 400, a flexible substrate such as a plastic substrate may be used.

The base insulating layer 436 can have a single-layer or a stacked-layer structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating layer 436 preferably has a single-layer structure or a stacked-layer structure including an oxide insulating film so that the oxide insulating film is in contact with the oxide semiconductor layer 403 to be formed later. Note that the base insulating layer 436 is not necessarily provided.

It is preferable that the base insulating layer 436 include a region containing oxygen in a proportion higher than that in the stoichiometric composition (hereinafter also referred to as an oxygen-excess region). This is because oxygen deficiency in the oxide semiconductor layer 403 to be formed later can be compensated owing to the oxygen-excess region. In the case where the base insulating layer 436 has a stacked-layer structure, the base insulating layer 436 preferably includes the oxygen-excess region at least in a layer in contact with the oxide semiconductor layer 403. In order to provide the oxygen-excess region in the base insulating layer 436, for example, the base insulating layer 436 may be formed in an oxygen atmosphere. Alternatively, the oxygen-excess region may be formed by adding oxygen (including at least one of an oxygen radical, an oxygen atom, and an oxygen ion) to the base insulating layer 436 after its formation. Oxygen can be added by an ion implantation method, an ion doping method, a plasma immersion ion implantation method, plasma treatment, or the like.

Figure 7A:
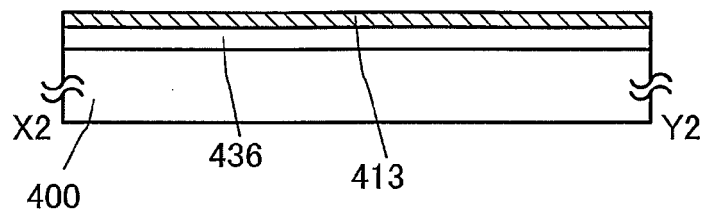
FIGS. 7A to 7D are diagrams illustrating an example of the semiconductor device.

Next, an oxide semiconductor layer 413 is formed over the base insulating layer 436 (see FIG. 7A). The thickness of the oxide semiconductor layer 413 is 3 nm to 30 nm, preferably 5 nm to 20 nm. As the oxide semiconductor layer 413, for example, the oxide semiconductor film described in Embodiment 1 can be used. Here, the substrate temperature in the film formation is higher than or equal to room temperature and lower than or equal to 450° C.

In addition, in the case where the crystallinity of the oxide semiconductor layer 413 needs to be increased, the temperature of heat treatment performed immediately after the deposition is completed is higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

Further, the oxide semiconductor layer 413 can be formed as follows: an oxide semiconductor film is deposited by a sputtering method and then part of the oxide semiconductor film is etched. For example, the oxide semiconductor layer 413 may be deposited with a plasma sputtering apparatus. A plasma sputtering apparatus is a sputtering apparatus which performs deposition with surfaces of a plurality of substrates set substantially perpendicular to a surface of a sputtering target.

For example, a sputtering target having a composition with which the oxide semiconductor layer 413 has the composition of the above oxide semiconductor film is preferably used for forming the oxide semiconductor layer 413. For example, an In—Ge—Sn—Zn—O oxide semiconductor film can be deposited using an oxide target having a composition ratio of In:Ge:Sn:Zn=4:1:1:6.

In the formation of the oxide semiconductor layer 413, the concentration of hydrogen contained in the oxide semiconductor layer 413 is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, and hydride have been removed; oxygen; or a mixed gas of oxygen and the rare gas is used as appropriate as an atmosphere gas supplied to a process chamber of a sputtering apparatus.

The oxide semiconductor layer 413 is formed in such a manner that a sputtering gas from which hydrogen and moisture are removed is introduced into a deposition chamber while moisture remaining in the deposition chamber is removed, whereby the concentration of hydrogen in the oxide semiconductor layer 413 can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. In the deposition chamber which is evacuated with a cryopump, for example, a hydrogen atom, a compound containing a hydrogen atom, such as water ($H_2O$), (more preferably, also a compound containing a carbon atom), and the like have high evacuation capability; therefore, the concentration of an impurity contained in the oxide semiconductor layer 413 deposited in the deposition chamber can be reduced.

In order to reduce the impurity concentration in the oxide semiconductor layer 413, it is also effective to deposit the oxide semiconductor layer 413 while the substrate 400 is kept at high temperature. The substrate 400 is heated at higher than or equal to 150° C. and lower than or equal to 450° C.

It is preferable to use a high-purity gas from which impurities such as hydrogen, water, a hydroxyl group, and hydride are removed as a sputtering gas used when the oxide semiconductor layer 413 is formed.

Before the oxide semiconductor layer 413 is deposited, planarization treatment may be performed on the surface where the oxide semiconductor layer 413 is deposited. As the planarization treatment, polishing treatment (e.g., a chemical mechanical polishing method), dry-etching treatment, or plasma treatment can be used, although there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface where the oxide semiconductor layer 413 is deposited.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface where the oxide semiconductor layer 413 is deposited.

Further, the oxide semiconductor layer 413 is preferably subjected to heat treatment for removing excess hydrogen (including water and a hydroxyl group) contained in the oxide semiconductor layer 413 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 413 after the dehydration or dehydrogenation treatment can be $5\times10^{19}/cm^3$ or lower, preferably $5\times10^{18}/cm^3$ or lower.

Note that the heat treatment for the dehydration or dehydrogenation may be performed at any timing in the process of manufacturing the field-effect transistor 422 as long as it is performed after the deposition of the oxide semiconductor layer 413. In the case where an aluminum oxide film is formed as the gate insulating layer 402 or the insulating layer 407, the heat treatment is preferably performed before the aluminum oxide film is formed. The heat treatment for the dehydration or dehydrogenation may be performed plural times, and may double as another heat treatment.

Note that in the case where a base insulating layer containing oxygen is provided as the base insulating layer 436, the heat treatment for the dehydration or dehydrogenation is preferably performed before the oxide semiconductor layer 413 is processed into an island shape, in which case release of oxygen contained in the base insulating layer 436 by the heat treatment can be prevented.

Note that in the heat treatment, it is preferable that water, hydrogen, and the like be not contained in nitrogen or a rare gas such as helium, neon, or argon. The purity of nitrogen or a rare gas such as helium, neon, or argon introduced into the heat treatment apparatus is preferably 6N (99.9999%) or more, more preferably 7N (99.99999%) or more (i.e., the impurity concentration is preferably 1 ppm or lower, more preferably 0.1 ppm or lower).

In addition, after the oxide semiconductor layer 413 is heated by the heat treatment, a high-purity oxygen gas, a high-purity dinitrogen monoxide gas, or ultra dry air (the moisture amount is 20 ppm or lower (−55° C. by conversion into a dew point), preferably 1 ppm or lower, more preferably 10 ppb or lower, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that the oxide semiconductor layer 413 can be a highly purified, i-type (intrinsic) oxide semiconductor film.

Further, oxygen (which includes at least one of an oxygen radical, an oxygen atom, and an oxygen ion) may be added to the oxide semiconductor layer after being subjected to the dehydration or dehydrogenation treatment to supply oxygen to the oxide semiconductor layer.

In the transistor described in this embodiment, oxygen is added to the dehydrated or dehydrogenated oxide semiconductor layer to be supplied thereto, so that the oxide semiconductor layer can be highly purified and be i-type (intrinsic). Variation in electrical characteristics of a field-effect transistor having a highly-purified and i-type (intrinsic) oxide semiconductor layer is suppressed, and the field-effect transistor is electrically stable.

In the step of addition of oxygen to the oxide semiconductor layer, oxygen may be directly added to the oxide semiconductor layer or may be added to the oxide semiconductor layer 413 through another film such as the gate insulating layer 402 or the insulating layer 407 to be formed later. An ion implantation method, an ion doping method, a plasma immersion ion implantation method, or the like may be employed for the addition of oxygen through another film, whereas a plasma treatment or the like can also be employed in addition to the above methods for the direct addition of oxygen to the exposed oxide semiconductor layer 413.

Oxygen can be introduced into the oxide semiconductor layer anytime after dehydration or dehydrogenation treatment is performed thereon. Further, oxygen may be added plural times to the oxide semiconductor layer after the dehydration or dehydrogenation treatment is performed.

Next, the oxide semiconductor layer 413 is processed into an island-shaped oxide semiconductor layer 403 by a photolithography step. As a mask used for the processing into the island-shaped oxide semiconductor layer 403 here, a mask which is formed by a photolithography method or the like and has a finer pattern formed by a slimming process is preferably used.

As the slimming process, an ashing process in which oxygen in a radical state (an oxygen radical) or the like is used can be employed, for example. However, the slimming process is not limited to the ashing process as long as the mask formed by a photolithography method or the like can be processed into a finer pattern. Note that the channel length (L) of a field-effect transistor is determined by the mask formed by the slimming process. Therefore, a process with high controllability is preferably employed as the slimming process.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can become more than or equal to 30 nm and less than or equal to 2000 nm, preferably more than or equal to 50 nm and less than or equal to 350 nm. This enables further miniaturization of the field-effect transistor.

Figure 7B:
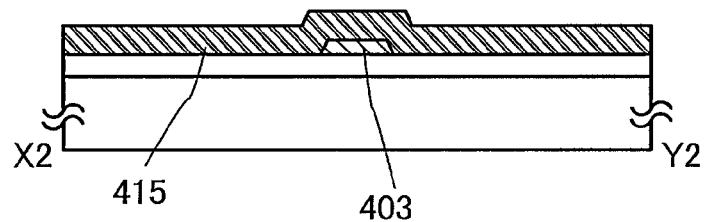
Figure 7C:
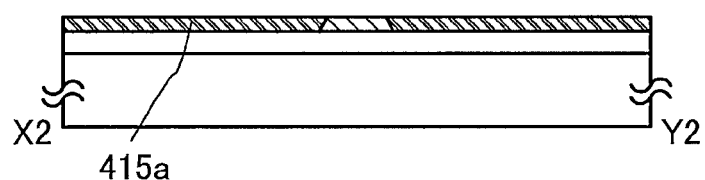

Next, a conductive film 415 which is to be a source electrode layer and a drain electrode layer (including a wiring formed in the same layer as the source electrode layer and the drain electrode layer) is formed over the island-shaped oxide semiconductor layer 403 (see FIG. 7B).

The conductive film 415 is formed using a material that can withstand heat treatment in a later step. For example, a metal film containing an element selected from Al, Cr, Cu, Ta, Ti, Mo, and W, a metal nitride film containing any of the above elements as a component (a titanium nitride film, a molybdenum nitride film, a tungsten nitride film), or the like can be used. A film of a high melting point metal such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. Alternatively, the conductive film 415 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used.

Next, polishing (cutting or grinding) treatment is performed on the conductive film 415 to remove part of the conductive film 415 so that the oxide semiconductor layer 403 is exposed. By the polishing treatment, a region of the conductive film 415 overlapping with the oxide semiconductor layer 403 is removed and a conductive film 415a having an opening in the region is thus formed (see FIG. 7C). As the polishing (cutting or grinding) method, chemical mechanical polishing (also referred to as CMP) treatment is preferably used. In this embodiment, the region of the conductive film 415 overlapping with the oxide semiconductor layer 403 is removed by CMP treatment.

Note that the CMP treatment may be performed only once or plural times. When the CMP treatment is performed plural times, it is preferable that first polishing be performed with a high polishing rate followed by final polishing with a low polishing rate. By performing polishing steps with different polishing rates in combination, the flatness of the surfaces of the source electrode layer 405a, the drain electrode layer 405b, and the oxide semiconductor layer 403 can be further increased.

Although CMP treatment is used for removing the region of the conductive film 415 overlapping with the oxide semiconductor layer 403 in this embodiment, another polishing (cutting or grinding) treatment may be used. Alternatively, polishing treatment such as CMP treatment may be combined with etching (dry etching or wet etching) treatment, plasma treatment, or the like. For example, after the CMP treatment, dry etching treatment or plasma treatment (e.g., reverse sputtering) may be performed in order to improve the flatness of a surface to be processed. When the polishing treatment is combined with etching treatment, plasma treatment, or the like, the order of steps is not particularly limited and may be set as appropriate depending on the materials, the film thicknesses, and the surface roughness of the conductive film 415.

The upper end portion of the conductive film 415a is substantially aligned with the upper end portion of the oxide semiconductor layer 403. Note that the shape of the conductive film 415a (or the source electrode layer 405a and the drain electrode layer 405b which are formed by processing the conductive film 415a) differs depending on the conditions of polishing treatment for removing the conductive film 415. For example, in some cases, a thickness of the conductive film 415a may be less than a thickness of the oxide semiconductor layer 403.

Figure 7D:
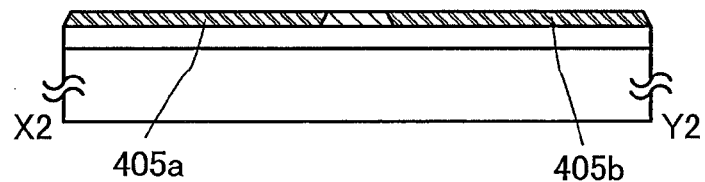

Next, the conductive film 415a is processed by a photolithography step to form the source electrode layer 405a and the drain electrode layer 405b (including a wiring formed using the same layer as the source electrode layer 405a and the drain electrode layer 405b) (see FIG. 7D).

Note that in this embodiment, a method is described in which the conductive film 415 is deposited, the region of the conductive film 415 overlapping with the oxide semiconductor layer 403 is removed by polishing treatment, and then, part of the conductive film is etched to form the source electrode layer 405a and the drain electrode layer 405b; however, a method is not limited thereto. The source electrode layer 405a and the drain electrode layer 405b may be formed by such a method that the conductive film 415 is deposited and processed by selective etching and then the region of the conductive film 415 overlapping with the oxide semiconductor layer 403 is removed by polishing treatment. Note that in the case where etching treatment is performed before polishing treatment, there is a need to prevent the region of the conductive film 415 overlapping with the oxide semiconductor layer 403 from being removed by the etching treatment.

In the example of a method for manufacturing a field-effect transistor described in this embodiment, etching treatment using a resist mask is not used in the step of removing the region of the conductive film 415 overlapping with the oxide semiconductor layer 403 to form the source electrode layer 405a and the drain electrode layer 405b. Thus, even when the width of the source electrode layer 405a and the drain electrode layer 405b in the channel length direction is miniaturized, a processing can be precisely performed. Consequently, in a process for manufacturing the semiconductor device, the field-effect transistor 420 having a miniaturized structure with less variation in shape or characteristics can be manufactured with high yield.

In the example of a method for manufacturing a field-effect transistor described in this embodiment, the region of the conductive film 415 overlapping with the oxide semiconductor layer 403 is removed, whereby the side surface of the oxide semiconductor layer 403 in the channel length direction can be in contact with the source electrode layer 405a or the drain electrode layer 405b. Since the oxide semiconductor layer 403 has a thickness as small as 3 nm to 30 nm, preferably 5 nm to 20 nm, contact area between the oxide semiconductor layer 403 and the source electrode layer 405a or the drain electrode layer 405b which is in contact with the side surface of the oxide semiconductor layer 403 can be reduced and contact resistance at the contact interface can be increased. Accordingly, even when the channel length (L) of the field-effect transistor 422 is shortened, electric field between the source electrode layer 405a and the drain electrode layer 405b can be relieved, and a short-channel effect such as shift of the threshold voltage can be controlled.

Next, the gate insulating layer 402 is formed over the oxide semiconductor layer 403, the source electrode layer 405a, and the drain electrode layer 405b.

The gate insulating layer 402 can be formed to have a thickness greater than or equal to 1 nm and less than or equal to 20 nm by a sputtering method, an MBE method, a CVD method, a pulse laser deposition method, an ALD method, or the like as appropriate. In addition, the gate insulating layer 402 may be formed by depositing an insulating film with a plasma sputtering apparatus.

As the thickness of the gate insulating layer 402 becomes larger, a short channel effect is enhanced more and the threshold voltage tends to shift more to the negative side. However, in the method for manufacturing the semiconductor device in this embodiment, the top surfaces of the source electrode layer 405a, the drain electrode layer 405b, and the oxide semiconductor layer 403 are planarized by polishing treatment; thus, coverage with the gate insulating layer 402 with a small thickness can be improved.

As a material for the gate insulating layer 402, for example, silicon oxide, gallium oxide, aluminum oxide, silicon nitride, silicon oxynitride, aluminum oxynitride, silicon nitride oxide, or the like can be used. It is preferable that the gate insulating layer 402 contain oxygen in a portion which is in contact with the oxide semiconductor layer 403. In particular, it is preferable that the oxygen content of the gate insulating layer 402 in (a bulk of) the film be in excess of that in the stoichiometric composition. For example, in the case where a silicon oxide film is used as the gate insulating layer 402, the composition formula thereof is preferably $SiO_{2+\alpha}$ ($\alpha>0$). In this embodiment, a silicon oxide film of $SiO_{2+\alpha}$ ($\alpha>0$) is used as the gate insulating layer 402. By using the silicon oxide film as the gate insulating layer 402, oxygen can be supplied to the oxide semiconductor layer 403, leading to favorable characteristics. Further, the gate insulating layer 402 is preferably formed in consideration of the size of a field-effect transistor to be formed and the step coverage with the gate insulating layer 402.

When the gate insulating layer 402 is formed using a high-k material such as hafnium oxide, yttrium oxide, hafnium silicate ($HfSi_xO_y$ ($x>0$, $y>0$)), hafnium silicate ($HfSiO_xN_y$ ($x>0$, $y>0$)) to which nitrogen is added, hafnium aluminate ($HfAl_xO_y$ ($x>0$, $y>0$)), or lanthanum oxide, gate leakage current can be reduced. The gate insulating layer 402 may be formed with either a single-layer structure or a stacked-layer structure.

Figure 8A:
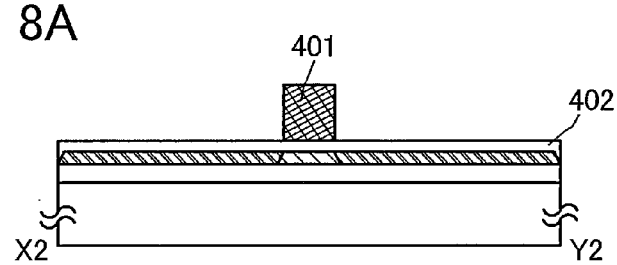
FIGS. 8A to 8C are diagrams illustrating an example of the semiconductor device.

Next, the gate electrode layer 401 is formed over the island-shaped oxide semiconductor layer 403 with the gate insulating layer 402 provided therebetween (see FIG. 8A). The gate electrode layer 401 can be formed by a plasma CVD method, a sputtering method, or the like. The gate electrode layer 401 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 401. The gate electrode layer 401 may be formed with either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating layer 402, a metal oxide containing nitrogen, specifically, an IGZO film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volt), preferably higher than or equal to 5.5 eV (electron volt); thus, when these are used as the gate electrode layer, the threshold voltage of the electrical characteristics of a field-effect transistor can be positive. Accordingly, a so-called normally-off switching element can be obtained.

Note that the gate electrode layer 401 can be formed by processing a conductive film (not illustrated) provided over the gate insulating layer 402 using a mask. As the mask used for the processing here, a mask which is formed by a photolithography method or the like and has a finer pattern formed by a slimming process is preferably used.

Figure 8B:
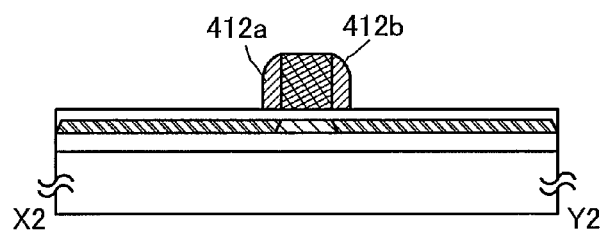

Then, a film containing a conductive material is deposited over the gate electrode layer 401 and the gate insulating layer 402 and is partly etched to form the sidewall layer 412a and the sidewall layer 412b (see FIG. 8B).

The sidewall layer 412a and the sidewall layer 412b have conductivity and can be formed, for example, by processing a metal film of tungsten, titanium, or the like, a silicon film containing an impurity element such as phosphorus or boron, or the like. Alternatively, the sidewall layer 412a and the sidewall layer 412b having conductivity can be formed as follows: a polycrystalline silicon film is deposited over the gate electrode layer 401 and the gate insulating layer 402, the polycrystalline silicon film is etched to form a sidewall layer which is in contact with the gate electrode layer 401, an impurity element such as phosphorus or boron is introduced into the sidewall layer by doping, and heat treatment for activation is performed.

Next, the insulating layer 407 is formed over the gate insulating layer 402, the gate electrode layer 401, the sidewall layer 412a, and the sidewall layer 412b.

The insulating layer 407 can be formed, for example, by a plasma CVD method, a sputtering method, an evaporation method, or the like. As the insulating layer 407, an inorganic insulating film such as a silicon oxide film, a silicon oxynitride film, an aluminum oxynitride film, or a gallium oxide film can be typically used.

Furthermore, as the insulating layer 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating layer 407 can be formed with either a single-layer structure or a stacked-layer structure, for example, a stack of a silicon oxide film and an aluminum oxide film can be used. The aluminum oxide film can be preferably used because it has a high shielding effect (blocking effect), which is impermeable to either or both oxygen and impurities such as hydrogen and moisture, and, in and after the manufacturing process, the aluminum oxide film functions as a protective film for preventing entry of an impurity such as hydrogen or moisture, which causes a change in characteristics, into the oxide semiconductor layer 403 and release of oxygen, which is a main constituent material of the oxide semiconductor, from the oxide semiconductor layer 403.

The insulating layer 407 is preferably formed by a method such as a sputtering method, in which an impurity such as water or hydrogen does not enter the insulating layer 407.

In order to remove residual moisture from the deposition chamber of the insulating layer 407 in a manner similar to that of the deposition of the oxide semiconductor layer 403, an entrapment vacuum pump (such as a cryopump) is preferably used. When the insulating layer 407 is deposited in the deposition chamber evacuated using a cryopump, the impurity concentration of the insulating layer 407 can be reduced. In addition, as an evacuation unit for removing moisture remaining in the film formation chamber of the insulating layer 407, a turbo molecular pump provided with a cold trap may be used.

In this embodiment, as the insulating layer 407, a stacked-layer structure in which an aluminum oxide film and a silicon oxide film are stacked in this order from the side which is in contact with the gate electrode layer 401 is employed. Note that the aluminum oxide film has a high density (film density higher than or equal to 3.2 g/cm$^3$, preferably higher than or equal to 3.6 g/cm$^3$), whereby the field-effect transistor 420 can have stable electrical characteristics. The film density can be measured by Rutherford backscattering spectrometry (also referred to as RBS) or X-ray reflectometer (also referred to as XRR).

Figure 8C:
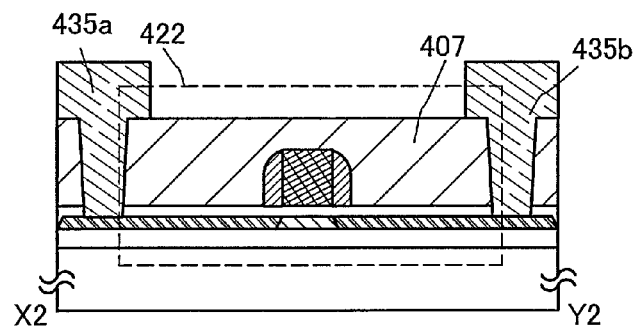

Next, openings reaching the source electrode layer 405a and the drain electrode layer 405b are formed in the insulating layer 407 and the gate insulating layer 402, and the wiring layer 435a and the wiring layer 435b are formed in the openings (see FIG. 8C). In the semiconductor device of this embodiment, for example, with the use of the wiring layer 435a and the wiring layer 435b, the field-effect transistor is connected to another field-effect transistor or another element, which can lead to formation of a variety of circuits.

For example, the wiring layer 435a and the wiring layer 435b can be formed using a material and a method similar to those of the gate electrode layer 401, the source electrode layer 405a, or the drain electrode layer 405b. For example, a metal film containing an element selected from Al, Cr, Cu, Ta, Ti, Mo, and W, a metal nitride film containing any of the above elements as a component (a titanium nitride film, a molybdenum nitride film, or a tungsten nitride film), or the like can be used. A film of a high melting point metal such as Ti, Mo, W, or the like or a metal nitride film of any of these elements (a titanium nitride film, a molybdenum nitride film, or a tungsten nitride film) may be stacked on one of or both of a lower side and an upper side of a metal film of Al, Cu, or the like. The wiring layer 435a and the wiring layer 435b may be formed using conductive metal oxide. As the conductive metal oxide, indium oxide ($In_2O_3$), tin oxide ($SnO_2$), zinc oxide (ZnO), indium oxide-tin oxide (ITO), indium oxide-zinc oxide ($In_2O_3$—ZnO), or any of these metal oxide materials in which silicon oxide is contained can be used.

For example, as the wiring layer 435a and the wiring layer 435b, a single layer of molybdenum film, a stack of a tantalum nitride film and a copper film, or a stack of a tantalum nitride film and a tungsten film can be used.

Through the above-described process, the field-effect transistor 422 of this embodiment can be formed.

Note that when the length of the island-shaped oxide semiconductor layer 403 in the channel length direction is larger than the length of the gate electrode layer 401 in the channel length direction, the degree of freedom of alignment for forming the gate electrode layer 401 can be increased. In that case, in order to decrease the channel length of the field-effect transistor, an impurity region may be provided in the oxide semiconductor layer 403.

Figure 9A:
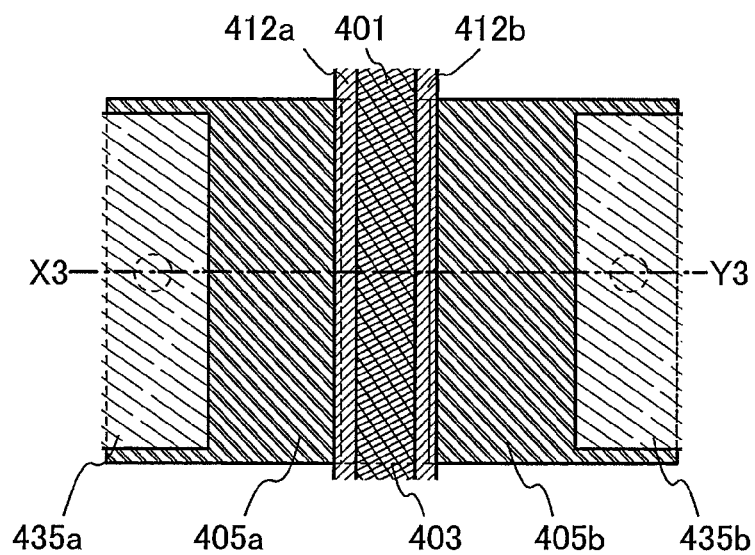
FIGS. 9A and 9B are diagrams illustrating an example of a semiconductor device.
Figure 9B:
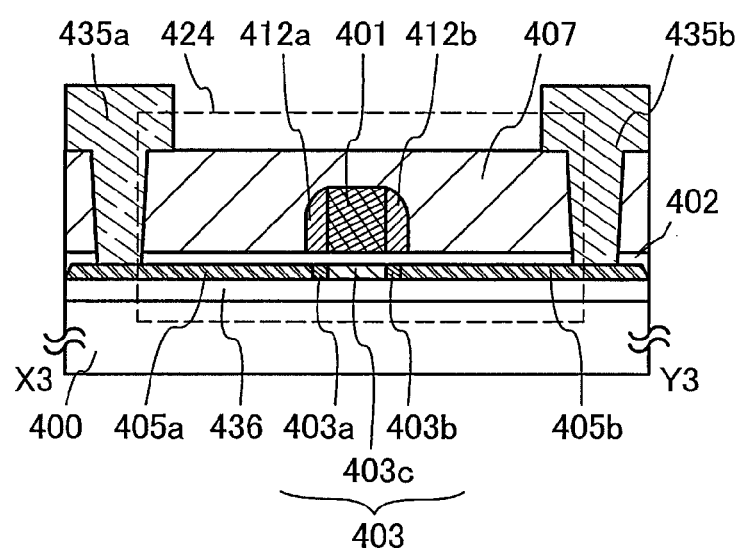
Figure 10A:
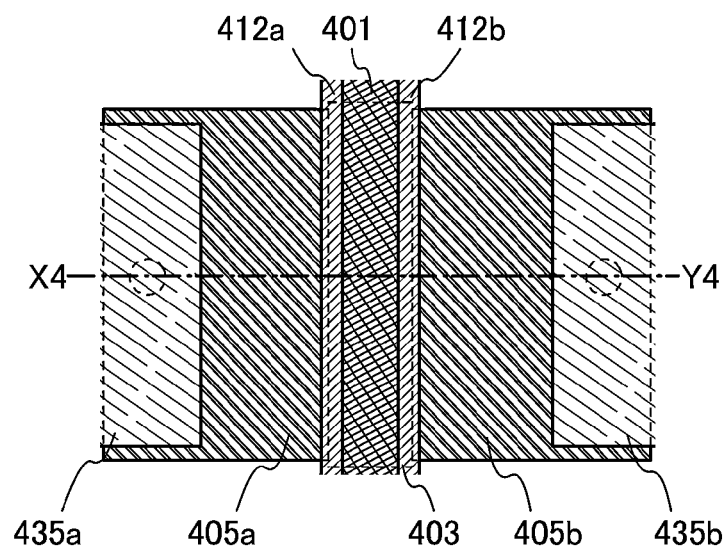
FIGS. 10A and 10B are diagrams illustrating an example of a semiconductor device.
Figure 10B:
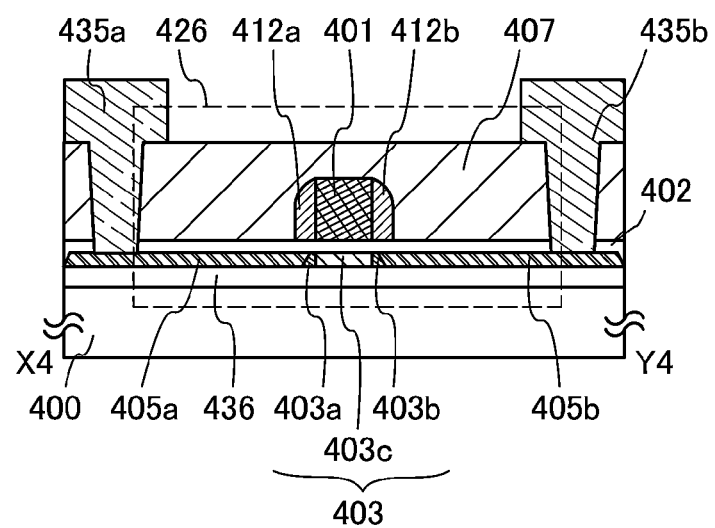

For example, a field-effect transistor 424 illustrated in FIGS. 9A and 9B and a field-effect transistor 426 illustrated in FIGS. 10A and 10B are examples which are formed as follows: the gate electrode layer 401 is formed and then an impurity is added to the oxide semiconductor layer 403 using the gate electrode layer 401 as a mask, so that an impurity region 403a and an impurity region 403b are formed in a self-aligned manner.

The field-effect transistor 424 has a structure similar to that of the field-effect transistor 420; the field-effect transistor 424 is different from the field-effect transistor 420 in that the oxide semiconductor layer 403 included in the field-effect transistor 424 has a pair of impurity regions (the impurity region 403a and the impurity region 403b) containing a dopant and a channel formation region 403c sandwiched between the pair of impurity regions. The field-effect transistor 426 illustrated in FIGS. 10A and 10B has a structure similar to that of the field-effect transistor 422; the field-effect transistor 426 is different from the field-effect transistor 422 in that the oxide semiconductor layer 403 included in the field-effect transistor 426 has a pair of impurity regions (the impurity region 403a and the impurity region 403b) containing a dopant and the channel formation region 403c sandwiched between the pair of impurity regions. Note that FIG. 9A is a plan view. FIG. 9B is a cross-sectional view taken along a line X3-Y3 of FIG. 9A. FIG. 10A is a plan view. FIG. 10B is a cross-sectional view taken along a line X4-Y4 of FIG. 10A.

The dopant is an impurity which changes the conductivity of the oxide semiconductor layer 403. As the method for adding the dopant, an ion implantation method, an ion doping method, a plasma immersion ion implantation method, or the like can be used.

With the oxide semiconductor layer including the pair of impurity regions between which the channel formation region 403c is provided in the channel length direction, on-state characteristics (e.g., on-state current and field-effect mobility) of the field-effect transistors 424 and 426 are increased, which enables high-speed operation and quick response.

As described above with reference to FIGS. 5A and 5B, FIGS. 6A and 6B, FIGS. 7A to 7D, FIGS. 8A to 8C, FIGS. 9A and 9B, and FIGS. 10A and 10B, an example of the semiconductor device in this embodiment includes a conductive layer (e.g., a gate electrode layer) having a function as a gate of a field-effect transistor, an insulating layer (e.g., a gate insulating layer) having a function as a gate insulating layer of the field-effect transistor, a semiconductor layer (e.g., a channel formation layer) having a function as a channel formation layer of the field-effect transistor, a conductive layer (e.g., a source electrode layer) having a function as one of a source and a drain of the field-effect transistor, and a conductive layer (e.g., a drain electrode layer) having a function as the other of the source and the drain of the field-effect transistor. The semiconductor layer is formed using the oxide semiconductor film in Embodiment 1.

In an example of the semiconductor device in this embodiment, the oxide semiconductor film described in Embodiment 1 is used as the semiconductor layer having a function as a channel formation layer of the field-effect transistor. The oxide semiconductor film described in Embodiment 1 has less oxygen deficiency and thus has a low possibility of occurrence of unnecessary carriers. Thus, off-state current of the field-effect transistor can be lowered and electrical characteristics of the field-effect transistor can be improved. In addition, since the oxide semiconductor film described in Embodiment 1 contains germanium (Ge), the oxide semiconductor film has a wide band gap. Thus, withstand voltage of the field-effect transistor can be improved, for example; accordingly, electrical characteristics of the field-effect transistor can be improved.

Embodiment 3

In this embodiment, an example of a semiconductor device which includes the field-effect transistor described in this specification, which can hold stored data even when not powered, and which does not have a limitation on the number of write cycles, will be described.

Figure 11A:
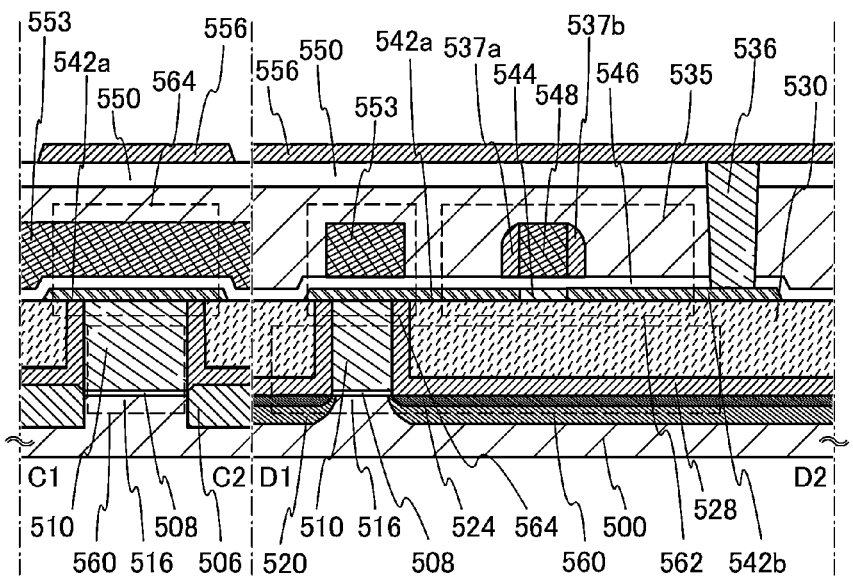
FIGS. 11A to 11C are diagrams illustrating an example of a semiconductor device.
Figure 11B:
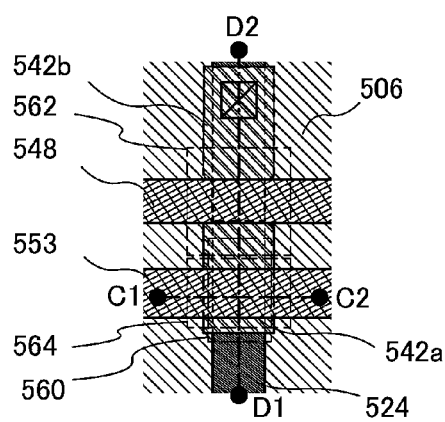
Figure 11C:
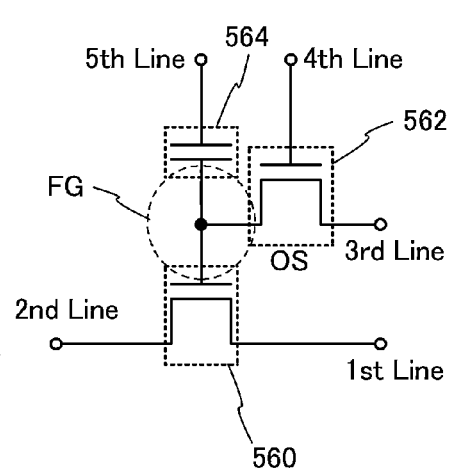

FIGS. 11A to 11C illustrate an example of a structure of a semiconductor device. FIG. 11A is a cross-sectional diagram of the semiconductor device. FIG. 11B is a plan view of the semiconductor device. FIG. 11C is a circuit diagram of the semiconductor device. Note that FIG. 11A corresponds to a cross-section taken along line C1-C2 and line D1-D2 of FIG. 11B.

The semiconductor device illustrated in FIGS. 11A and 11B includes a field-effect transistor 560 including a first semiconductor material in a lower portion and a field-effect transistor 562 including a second semiconductor material (in this embodiment, the oxide semiconductor film described in Embodiment 1) in an upper portion. Note that FIGS. 11A to 11C illustrate an example in which the structure of the field-effect transistor 420 described in Embodiment 2 is applied to that of the field-effect transistor 562.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A field-effect transistor including a material other than an oxide semiconductor can operate at high speed easily. On the other hand, charge can be held in a field-effect transistor including an oxide semiconductor for a long time owing to its characteristics.

Although all the field-effect transistors are n-channel field-effect transistors, it is needless to say that p-channel field-effect transistors can be used. The specific structure of the semiconductor device is not necessarily limited to those described here such as the material used for the semiconductor device and the structure of the semiconductor device (e.g., the use of the field-effect transistor described in Embodiment 2, which is formed using an oxide semiconductor, as the field-effect transistor 562 for holding information).

The field-effect transistor 560 in FIG. 11A includes a channel formation region 516 provided over a semiconductor substrate 500 including a semiconductor material (e.g., silicon), impurity regions 520 with the channel formation region 516 provided therebetween, intermetallic compound regions 524 which are in contact with the impurity regions 520, a gate insulating layer 508 provided over the channel formation region 516, and a gate electrode layer 510 provided over the gate insulating layer 508. Note that a transistor whose source electrode layer and drain electrode layer are not illustrated in a drawing may also be referred to as a field-effect transistor for the sake of convenience. Further, in such a case, in description of a connection of a field-effect transistor, a source region may be collectively referred to as a source electrode layer, and a drain region may be collectively referred to as a drain electrode layer. That is, in this specification, the term "source electrode layer" may include a source region.

An element isolation insulating layer 506 is provided over the substrate 500 to surround the field-effect transistor 560. An insulating layer 528 and an insulating layer 530 are provided to overlap the field-effect transistor 560. Note that, in the field-effect transistor 560, sidewall insulating layers may be formed on side surfaces of the gate electrode layer 510 and the impurity regions 520 may include a region having a different impurity concentration.

The field-effect transistor 560 formed using a single crystal semiconductor substrate can operate at high speed. With the use of that field-effect transistor as a field-effect transistor for reading, data can be read at high speed. In this embodiment, two insulating films are formed to cover the field-effect transistor 560. Note that a single insulating film or a stack of three or more insulating films may be formed. As treatment prior to formation of the field-effect transistor 560 and a capacitor 564, CMP treatment is performed on the insulating films formed over the field-effect transistor 560, whereby an insulating layer 528 and an insulating layer 530 which are planarized are formed and, at the same time, an upper surface of the gate electrode layer 510 is exposed.

As the insulating layers 528 and 530, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating layers 528 and 530 can be formed by a plasma CVD method, a sputtering method, or the like.

Alternatively, an organic material such as a polyimide resin, an acrylic resin, or a benzocyclobutene-based resin can be used. Other than such organic materials, it is also possible to use a low-dielectric constant material (a low-k material) or the like. In the case of using an organic material, the insulating layer 528 and the insulating layer 530 may be formed by a wet method such as a spin coating method or a printing method.

Note that in this embodiment, a silicon nitride film is used as the insulating layer 528, and a silicon oxide layer is used as the insulating layer 530.

Planarization treatment is preferably performed on the surface of the insulating layer 530 in the formation region of the oxide semiconductor layer 544. In this embodiment, the oxide semiconductor layer 544 is formed over the insulating layer 530 sufficiently planarized by polishing treatment (e.g., CMP treatment) (the average surface roughness of the surface of the insulating layer 530 is preferably less than or equal to 0.15 nm).

The field-effect transistor 562 illustrated in FIG. 11A is a field-effect transistor in which the oxide semiconductor film described in Embodiment 1 is used as the oxide semiconductor layer having a function as a channel formation layer. Here, the oxide semiconductor layer 544 included in the field-effect transistor 562 is preferably highly purified. By using a highly purified oxide semiconductor, the field-effect transistor 562 which has extremely favorable off-state current characteristics can be obtained.

Since the off-state current of the field-effect transistor 562 is small, stored data can be held for a long time owing to such a field-effect transistor. In other words, power consumption can be sufficiently reduced because a semiconductor device in which refresh operation is unnecessary or the frequency of refresh operation is extremely low can be provided.

The field-effect transistor 562 includes the oxide semiconductor layer 544 whose side surfaces in the channel length direction are in contact with an electrode layer 542a and an electrode layer 542b. Thus, resistances of regions where the oxide semiconductor layer 544 is in contact with the electrode layers 542a and 542b can be increased, whereby an electric field between the source and the drain can be relieved. Accordingly, a short-channel effect in accordance with miniaturization of a size of the field-effect transistor can be suppressed.

In addition, the field-effect transistor 562 includes conductive sidewall layers 537a and 537b on side surfaces of a gate electrode layer 548 in the channel length direction. Thus, the conductive sidewall layer 537a and the conductive sidewall layer 537b overlap with the electrode layer 542a and the electrode layer 542b, respectively, with the gate insulating layer 546 provided therebetween. That is, the field-effect transistor substantially includes $L_{ov}$ regions. Accordingly, a decrease in on-state current of the field-effect transistor 562 can be suppressed.

An interlayer insulating film 535 and an insulating layer 550 which have a single-layer structure or a stacked-layer structure are provided over the field-effect transistor 562. In this embodiment, an aluminum oxide film is used as the insulating layer 550. The density of the aluminum oxide film is made to be high (the film density is higher than or equal to 3.2 g/cm$^3$, preferably higher than or equal to 3.6 g/cm$^3$), whereby stable electrical characteristics can be given to the field-effect transistor 562.

Further, a conductive layer 553 is provided to overlap with the electrode layer 542a of the field-effect transistor 562 with the gate insulating layer 546 provided therebetween. The capacitor 564 is formed of the electrode layer 542a, the gate insulating layer 546, and the conductive layer 553. That is, the electrode layer 542a of the field-effect transistor 562 functions as one electrode of the capacitor 564, and the conductive layer 553 functions as the other electrode of the capacitor 564. Note that in the case where a capacitor is not needed, the capacitor 564 may be omitted. Alternatively, the capacitor 564 may be separately provided above the field-effect transistor 562.

In this embodiment, the conductive layer 553 can be formed in the same manufacturing step as that of the gate electrode layer 548 of the field-effect transistor 562. Note that in the step of forming the sidewall layer 537a and the sidewall layer 537b on the side surfaces of the gate electrode layer 548, sidewall layers may be formed on side surfaces of the conductive layer.

In addition, a wiring 556 for connecting the field-effect transistor 562 to another field-effect transistor is provided over the insulating layer 550. The wiring 556 is electrically connected to the electrode layer 542b through an electrode layer 536 formed in an opening formed in the insulating layer 550, the interlayer insulating film 535, the gate insulating layer 546, and the like.

In FIGS. 11A and 11B, the field-effect transistor 560 is provided so as to overlap with at least part of the field-effect transistor 562. The source region or the drain region of the field-effect transistor 560 is preferably provided so as to overlap with part of the oxide semiconductor layer 544. In addition, the field-effect transistor 562 and the capacitor 564 are provided so as to overlap with the field-effect transistor 560 at least partly. For example, the conductive layer 553 of the capacitor 564 is provided so as to overlap with the gate electrode layer 510 of the field-effect transistor 560 at least partly. With such a planar layout, the area occupied by the semiconductor device can be reduced; thus, higher integration can be achieved.

Note that the electrical connection between the electrode layer 542b and the wiring 556 may be established by direct contact of the electrode layer 542b and the wiring 556 without providing the electrode layer 536. Alternatively, the electrical connection may be established through a plurality of electrode layers.

Next, an example of a circuit configuration corresponding to FIGS. 11A and 11B is illustrated in FIG. 11C.

In FIG. 11C, a first wiring (a 1st Line) is electrically connected to the source electrode layer of the field-effect transistor 560, and a second wiring (a 2nd Line) is electrically connected to a drain electrode layer of the field-effect transistor 560. A third wiring (3rd Line) is electrically connected to one of the source electrode layer and the drain electrode layer of the field-effect transistor 562, and a fourth wiring (4th Line) is electrically connected to a gate electrode layer of the field-effect transistor 562. A gate electrode of the field-effect transistor 560 and one of the source electrode layer and the drain electrode layer of the field-effect transistor 562 are electrically connected to one electrode of the capacitor 564. A fifth wiring (5th Line) and the other electrode of the capacitor 564 are electrically connected to each other.

The semiconductor device in FIG. 11C can write, hold, and read data as described below, utilizing a characteristic in which the potential of the gate electrode layer of the field-effect transistor 560 can be held.

Writing and holding of data are described. First, the potential of the fourth wiring is set to a potential at which the field-effect transistor 562 is turned on, whereby the field-effect transistor 562 is turned on. Accordingly, the potential of the third wiring is supplied to the gate electrode layer of the field-effect transistor 560 and the capacitor 564. In other words, a predetermined charge is supplied to the gate electrode layer of the field-effect transistor 560 (i.e., writing of data). Here, one of electric charges for supply of two different potentials (hereinafter referred to as a low-level electric charge and a high-level electric charge) is given. After that, the potential of the fourth wiring is set to a potential at which the field-effect transistor 562 is turned off, so that the field-effect transistor 562 is turned off. Thus, the potential given to the gate electrode layer of the field-effect transistor 560 is held (i.e., holding of data).

Since the off-state current of the field-effect transistor 562 is extremely low, the charge of the gate electrode layer of the field-effect transistor 560 is held for a long time.

Secondly, reading of data is described. By supplying an appropriate potential (reading potential) to the fifth wiring with a predetermined potential (constant potential) supplied to the first wiring, the potential of the second wiring varies depending on the amount of charge held in the gate electrode of the field-effect transistor 560. This is because in general, when the field-effect transistor 560 is an n-channel transistor, an apparent threshold voltage $V_{th\_H}$ in the case where the high-level potential is given to the gate electrode layer of the field-effect transistor 560 is lower than an apparent threshold voltage $V_{th\_L}$ in the case where the low-level charge is given to the gate electrode layer of the field-effect transistor 560. Here, the apparent threshold voltage refers to the potential of the fifth wiring, which is needed to turn on the field-effect transistor 560. Thus, the potential of the fifth wiring is set to potential $V_0$ that is intermediate between $V_{th\_H}$ and $V_{th\_L}$, whereby charge supplied to the gate electrode layer of the field-effect transistor 560 can be determined. For example, in the case where the high-level electric charge is given in writing, when the potential of the fifth wiring is set to $V_0$ ($>V_{th\_H}$), the field-effect transistor 560 is turned on. In the case where a low-level charge is given in writing, even when the potential of the fifth wiring is set to $V_0$ ($<V_{th\_L}$), the field-effect transistor 560 remains in an off state. Therefore, the stored data can be read by the potential of the second wiring.

Note that in the case where memory cells are arrayed, only data of desired memory cells needs to be read. In the case where such reading is not performed, a potential at which the field-effect transistor 560 is turned off regardless of the state of the gate electrode layer of the field-effect transistor 560, that is, a potential smaller than $V_{th\_H}$ may be given to the fifth wiring. Alternatively, a potential at which the field-effect transistor 560 is turned on regardless of the state of the gate electrode layer, that is, a potential higher than $V_{th\_L}$ may be given to the fifth wiring.

In the semiconductor device described in this embodiment, the field-effect transistor in which an oxide semiconductor layer described in Embodiment 1 is used as an oxide semiconductor layer having a function as a channel formation layer and in which off-state current is extremely low is applied, whereby stored data can be held for an extremely long time. In other words, power consumption can be adequately reduced because refresh operation becomes unnecessary or the frequency of refresh operation can be extremely low. Moreover, stored data can be held for a long period even when power is not supplied (note that a potential is preferably fixed).

The semiconductor device in this embodiment does not need high voltage for writing data and has no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to an embodiment of the present invention does not have a limit on the number of times of writing which is a problem in a conventional nonvolatile memory, and reliability thereof is drastically improved. Furthermore, data is written depending on ON and OFF of the field-effect transistor, whereby high-speed operation can be easily realized.

As described above, a miniaturized and highly-integrated semiconductor device having high electrical characteristics and a method for manufacturing the semiconductor device can be provided.

Embodiment 4

In this embodiment, a semiconductor device which includes the field-effect transistor described in Embodiment 2, which can hold stored data even when not powered, which has an unlimited number of write cycles, and which has a structure different from the structure described in Embodiment 3 is described with reference to FIGS. 12A and 12B and FIGS. 13A and 13B.

Figure 12A:
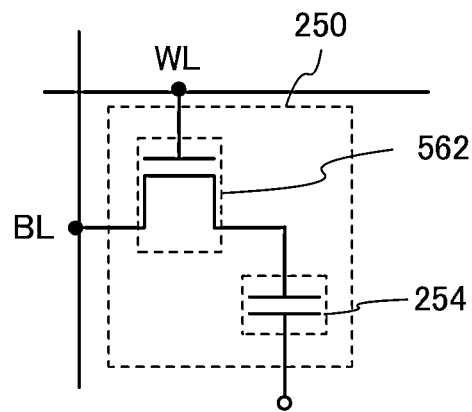
FIGS. 12A and 12B are diagrams illustrating an example of a semiconductor device.
Figure 12B:
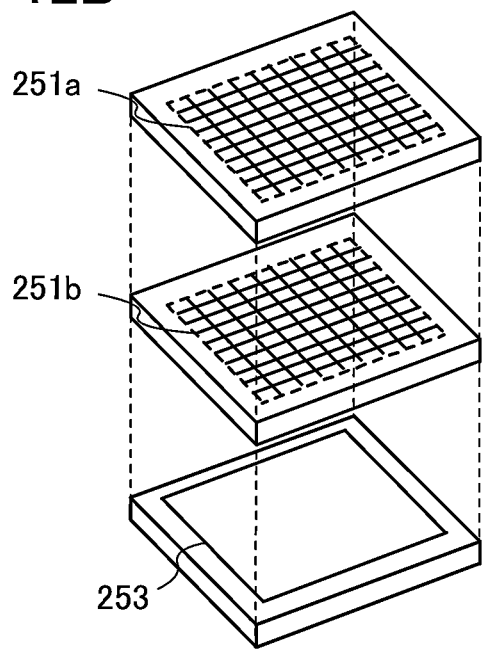

FIG. 12A is an example illustrating a circuit configuration of a semiconductor device. FIG. 12B is a conceptual diagram illustrating an example of a semiconductor device. First, the semiconductor device illustrated in FIG. 12A is described, and then, the semiconductor device illustrated in FIG. 12B is described.

In the semiconductor device illustrated in FIG. 12A, a bit line BL is electrically connected to the source electrode layer or the drain electrode layer of the field-effect transistor 562, a word line WL is electrically connected to the gate electrode layer of the field-effect transistor 562, and the source electrode layer or the drain electrode layer of the field-effect transistor 562 is electrically connected to a first terminal of a capacitor 254.

Next, writing and holding of data in the semiconductor device (a memory cell 250) illustrated in FIG. 12A are described.

First, the potential of the word line WL is set to a potential at which the field-effect transistor 562 is turned on, so that the field-effect transistor 562 is turned on. Accordingly, the potential of the bit line BL is supplied to the first terminal of the capacitor 254 (i.e., writing of data). After that, the potential of the word line WL is set to a potential at which the field-effect transistor 562 is turned off, so that the field-effect transistor 562 is turned off. Thus, the charge at the first terminal of the capacitor 254 is held (i.e., holding of data).

The field-effect transistor 562 in which the oxide semiconductor film described in Embodiment 1 is used as the oxide semiconductor layer having a function as a channel formation layer has a characteristic of extremely low off-state current. For that reason, a potential of the first terminal of the capacitor 254 (or a charge accumulated in the capacitor 254) can be held for an extremely long period by turning off the field-effect transistor 562.

Secondly, reading of data is described. When the field-effect transistor 562 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where $V$ is the potential of the first terminal of the capacitor 254, $C$ is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 12A can hold charge that is accumulated in the capacitor 254 for a long time because the off-state current of the field-effect transistor 562 is extremely small. In other words, power consumption can be adequately reduced because refresh operation becomes unnecessary or the frequency of refresh operation can be extremely low. Moreover, stored data can be retained for a long time even when power is not supplied.

Next, the semiconductor device illustrated in FIG. 12B is described.

The semiconductor device illustrated in FIG. 12B includes a memory cell array 251 (memory cell arrays 251a and 251b) including a plurality of memory cells 250 illustrated in FIG. 12A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 12B, the peripheral circuit 253 can be provided under the memory cell array 251 (memory cell arrays 251a and 251b). Thus, the size of the semiconductor device can be decreased.

It is preferable that a semiconductor material of the field-effect transistor provided in the peripheral circuit 253 be different from that of the field-effect transistor 562. For example, silicon, germanium, silicon germanium, silicon carbide, gallium arsenide, or the like can be used, and a single crystal semiconductor is preferably used. Alternatively, an organic semiconductor material or the like may be used. A field-effect transistor including such a semiconductor material can operate at sufficiently high speed. Therefore, a variety of circuits (e.g., a logic circuit or a driver circuit) which need to operate at high speed can be favorably realized with the use of the field-effect transistor.

Note that FIG. 12B illustrates, as an example, the semiconductor device in which two memory cell arrays 251 (the memory cell arrays 251a and 251b) are stacked; however, the number of memory cells to be stacked is not limited thereto. Three or more memory cells may be stacked.

Next, a specific structure of the memory cell 250 illustrated in FIG. 12A is described with reference to FIGS. 13A and 13B.

Figure 13A:
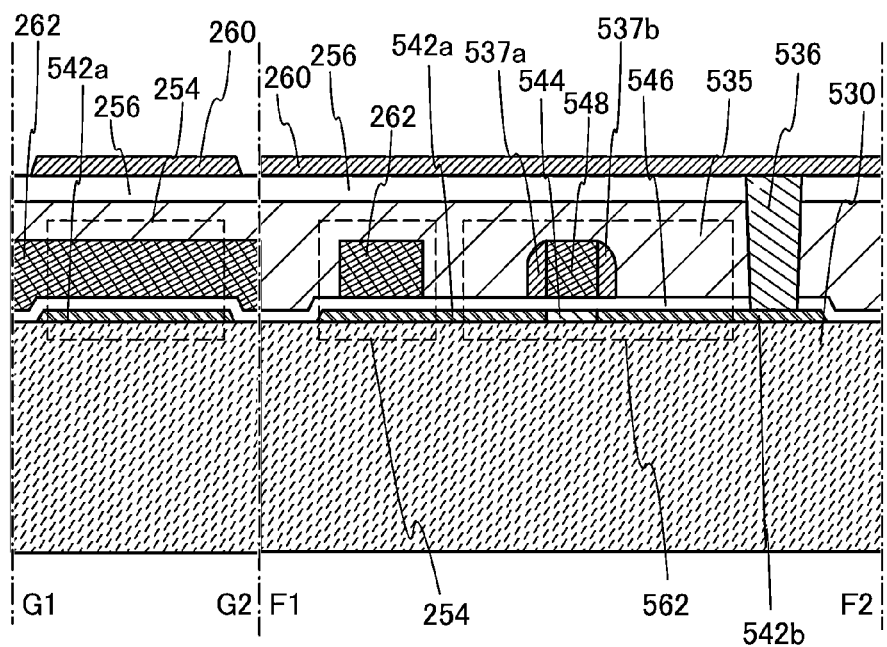
FIGS. 13A and 13B are diagrams illustrating an example of the semiconductor device.
Figure 13B:
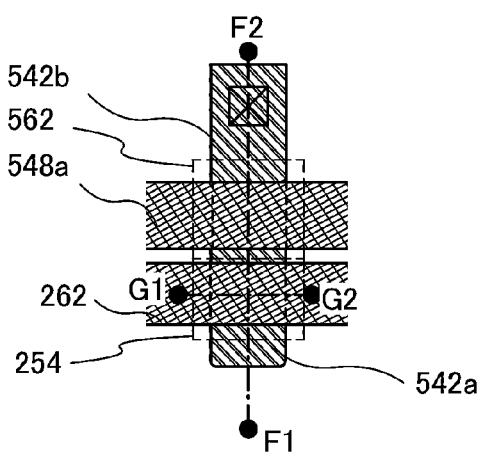

FIGS. 13A and 13B illustrate an example of a structure of the memory cell 250. FIG. 13A illustrates a cross-sectional view of the memory cell 250. FIG. 13B is a plan view of the memory cell 250. Here, FIG. 13A illustrates a cross section taken along line F1-F2 and line G1-G2 in FIG. 13B.

The field-effect transistor 562 in FIGS. 13A and 13B can have the same structure as the field-effect transistor in Embodiment 2.

In addition, a conductive layer 262 is provided in a region overlapping with the electrode layer 542a of the field-effect transistor 562 with the gate insulating layer 546 provided therebetween, and the electrode layer 542a, the gate insulating layer 546, and the conductive layer 262 form the capacitor 254. That is, the electrode layer 542a of the field-effect transistor 562 functions as one electrode of the capacitor 254, and the conductive layer 262 functions as the other electrode of the capacitor 254.

The interlayer insulating film 535 and the insulating layer 256 are formed with a single-layer structure or a stacked-layer structure over the field-effect transistor 562 and the capacitor 254. Further, a wiring 260 for connecting the memory cell 250 to an adjacent memory cell 250 is provided over the insulating layer 256. The wiring 260 is electrically connected to the electrode layer 542b of the field-effect transistor 562 through an opening formed in the insulating layer 256, the interlayer insulating film 535, the gate insulating layer 546, and the like. Note that the wiring 260 and the electrode layer 542b may be directly connected to each other. Note that the wiring 260 corresponds to the bit line BL in the circuit diagram of FIG. 12A.

In FIGS. 13A and 13B, the electrode layer 542b of the field-effect transistor 562 can also function as a source of a field-effect transistor included in an adjacent memory cell. With such a planar layout, the area occupied by the semiconductor device can be reduced; thus, higher integration can be achieved.

Adoption of the planar layout illustrated in FIG. 13A enables the area occupied by the semiconductor device to be reduced, whereby the degree of integration can be increased.

As describe above, the plurality of memory cells is formed in multiple layers with the field-effect transistor in which the oxide semiconductor film described in Embodiment 1 is used as the oxide semiconductor layer having a function as a channel formation layer. The field-effect transistor in which the oxide semiconductor film described in Embodiment 1 is used as the oxide semiconductor layer having a function as a channel formation layer has a low off-state current. Thus, with such a field-effect transistor, stored data can be held for a long time. That is, the frequency of refresh operation can be extremely lowered, which leads to a sufficient reduction in power consumption.

A semiconductor device having a novel feature can be obtained by being provided with both a peripheral circuit including the field-effect transistor including a material other than an oxide semiconductor (in other words, a field-effect transistor capable of operating at sufficiently high speed) and a memory circuit including the field-effect transistor including an oxide semiconductor film described in Embodiment 1 as an oxide semiconductor layer having a function as a channel formation layer (in a broader sense, a field-effect transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electrical characteristics and a method for manufacturing the semiconductor device can be provided.

Embodiment 5

In this embodiment, examples of application of the semiconductor device described in Embodiments 3 and 4 to a portable device such as a mobile phone, a smartphone, or an e-book reader are described with reference to FIGS. 14A and 14B, FIG. 15, FIG. 16, and FIG. 17.

In portable devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 14A:
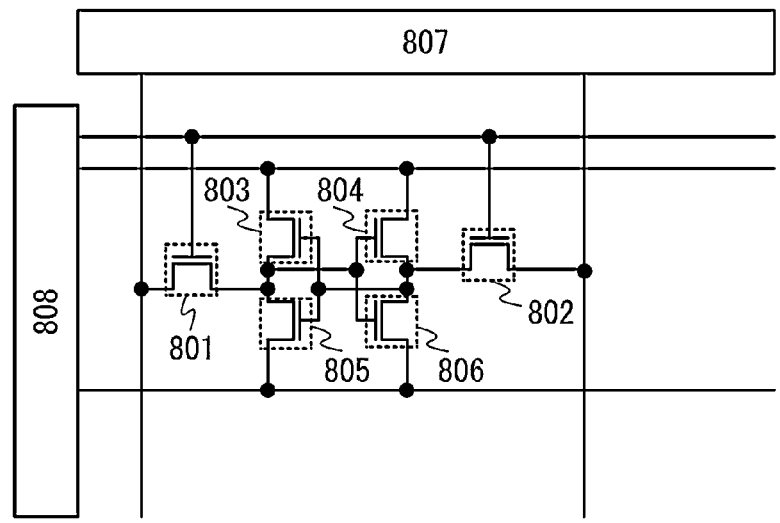
FIGS. 14A and 14B are diagrams each illustrating an example of a semiconductor device.

In an ordinary SRAM, as illustrated in FIG. 14A, one memory cell includes six field-effect transistors, that is, field-effect transistors 801 to 806, which are driven with an X decoder 807 and a Y decoder 808. The field-effect transistors 803 and 805, and the field-effect transistors 804 and 806 form inverters, which enables high-speed driving. However, since one memory cell consists of six field-effect transistors, there is a drawback of large cell area. Provided that the minimum feature size of a design rule is F, the area of a memory cell in an SRAM is generally $100 F^2$ to $150 F^2$. Therefore, a price per bit of an SRAM is the most expensive among a variety of memory devices.

Figure 14B:
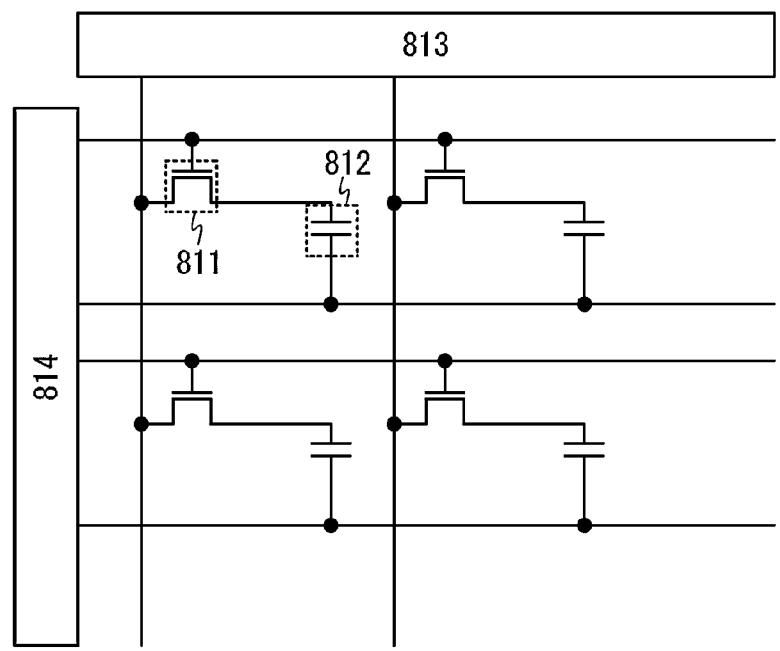

On the other hand, as shown in FIG. 14B, a memory cell in a DRAM includes a field-effect transistor 811 and a storage capacitor 812, and is driven by an X decoder 813 and a Y decoder 814. One cell includes one field-effect transistor and one capacitor and thus the area of a memory cell is small. The area of a memory cell of a DRAM is generally less than or equal to $10 F^2$. Note that the DRAM needs to be refreshed periodically and consumes electric power even when a rewriting operation is not performed.

On the other hand, the memory cell of the semiconductor device described in the above embodiments has an area of approximately $10 F^2$ and does not need to be refreshed frequently. Therefore, the area of the memory cell is reduced, and the power consumption can be reduced.

Figure 15:
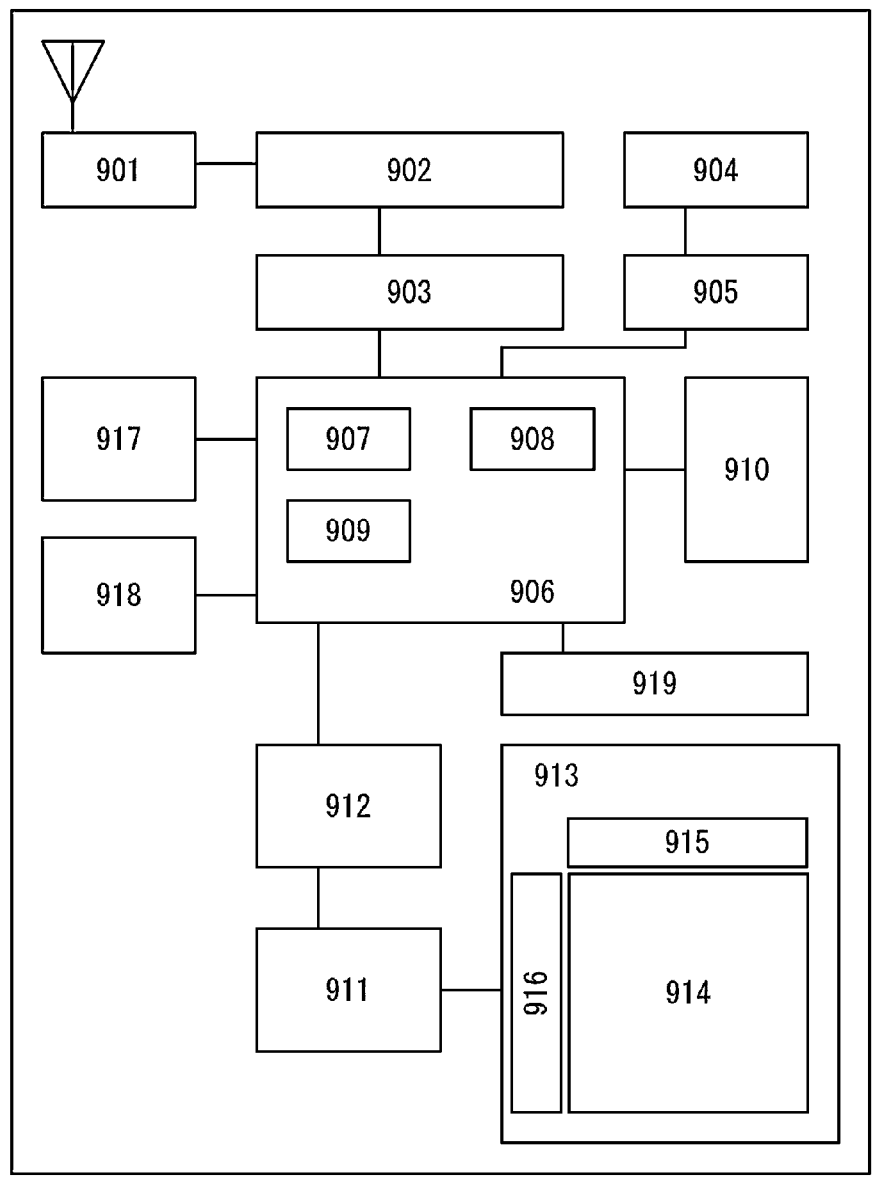
FIG. 15 is a diagram illustrating an example of a semiconductor device.

FIG. 15 is a block diagram of a portable device. The portable device illustrated in FIG. 15 includes an RF circuit 901, an analog baseband circuit 902, a digital baseband circuit 903, a battery 904, a power supply circuit 905, an application processor 906, a memory 910 such as a flash memory, a display controller 911, a memory 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory 912 includes an SRAM or a DRAM; by employing the semiconductor device described in Embodiment 3 or 4 for the memory 912, it is possible to provide a portable device in which writing and reading of data can be performed at high speed, data can be held for a long time, and power consumption can be sufficiently reduced.

Figure 16:
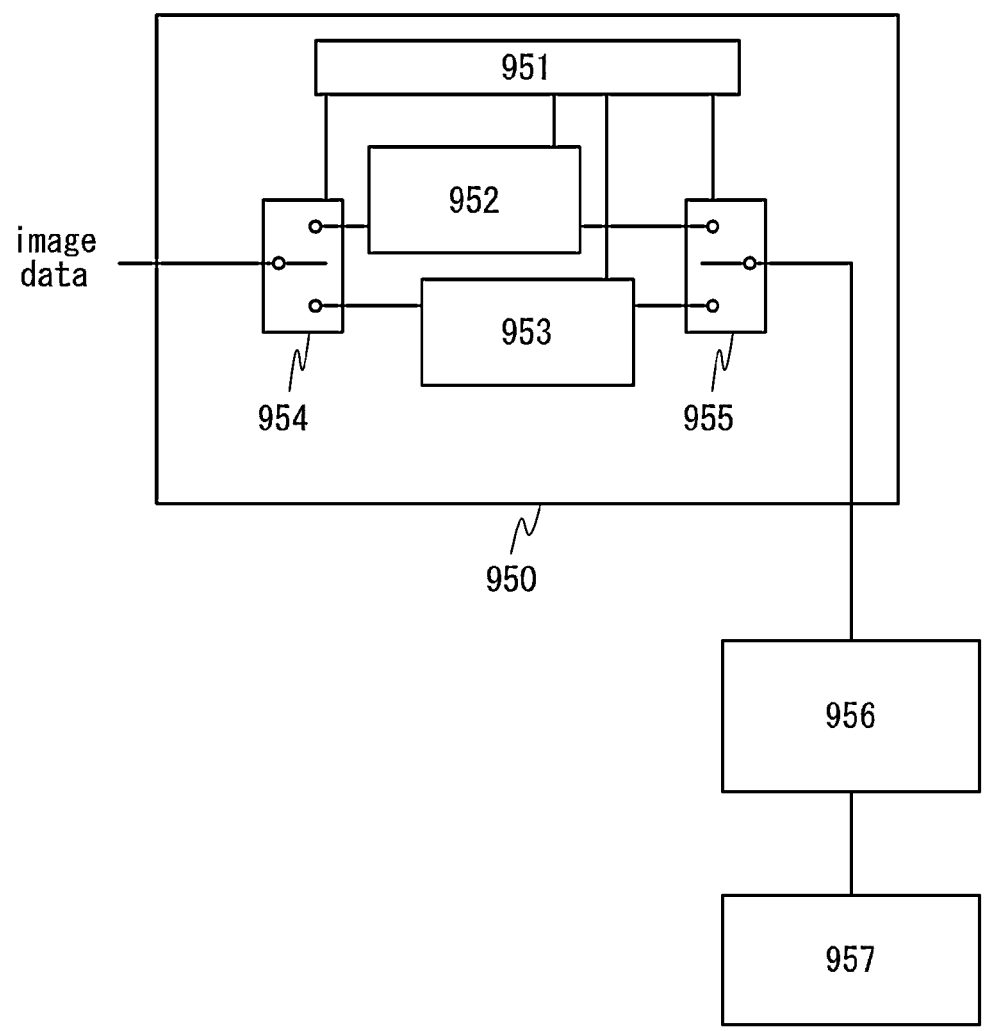
FIG. 16 is a diagram illustrating an example of a semiconductor device.

FIG. 16 shows an example in which the semiconductor device described in the above embodiments is used for a memory 950 in a display. The memory 950 illustrated in FIG. 16 includes a memory circuit 952, a memory circuit 953, a switch 954, a switch 955, and a memory controller 951. Further, in the memory 950, image data input from a signal line (input image data), a display controller 956 which reads and controls data held in the memory circuits 952 and 953, and a display 957 which displays data by a signal from the display controller 956 are connected.

First, image data (input image data A) is formed by an application processor (not shown). The input image data A is stored in the memory circuit 952 through the switch 954. Then, the image data stored in the memory circuit 952 (stored image data A) is transmitted to the display 957 through the switch 955 and the display controller 956, and is displayed on the display 957.

When the input image data A remains unchanged, the stored image data A is read from the memory circuit 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory circuit 953 through the switch 954. The stored image data A is read periodically from the memory circuit 952 through the switch 955 even during that time. After the completion of storing the new image data (the stored image data B) in the memory circuit 953, from the next frame for the display 957, the stored image data B starts to be read, transmitted to the display 957 through the switch 955 and the display controller 956, and displayed on the display 957. This reading operation continues until the next new image data is stored in the memory circuit 952.

By alternately writing and reading image data to and from the memory circuits 952 and 953 as described above, images are displayed on the display 957. Note that the memory circuit 952 and the memory circuit 953 are not limited to separate memories, and a single memory may be divided and used. By employing the semiconductor device described in Embodiment 3 or 4 for the memory circuits 952 and 953, data can be written and read at high speed and held for a long time, and power consumption can be sufficiently reduced.

Figure 17:
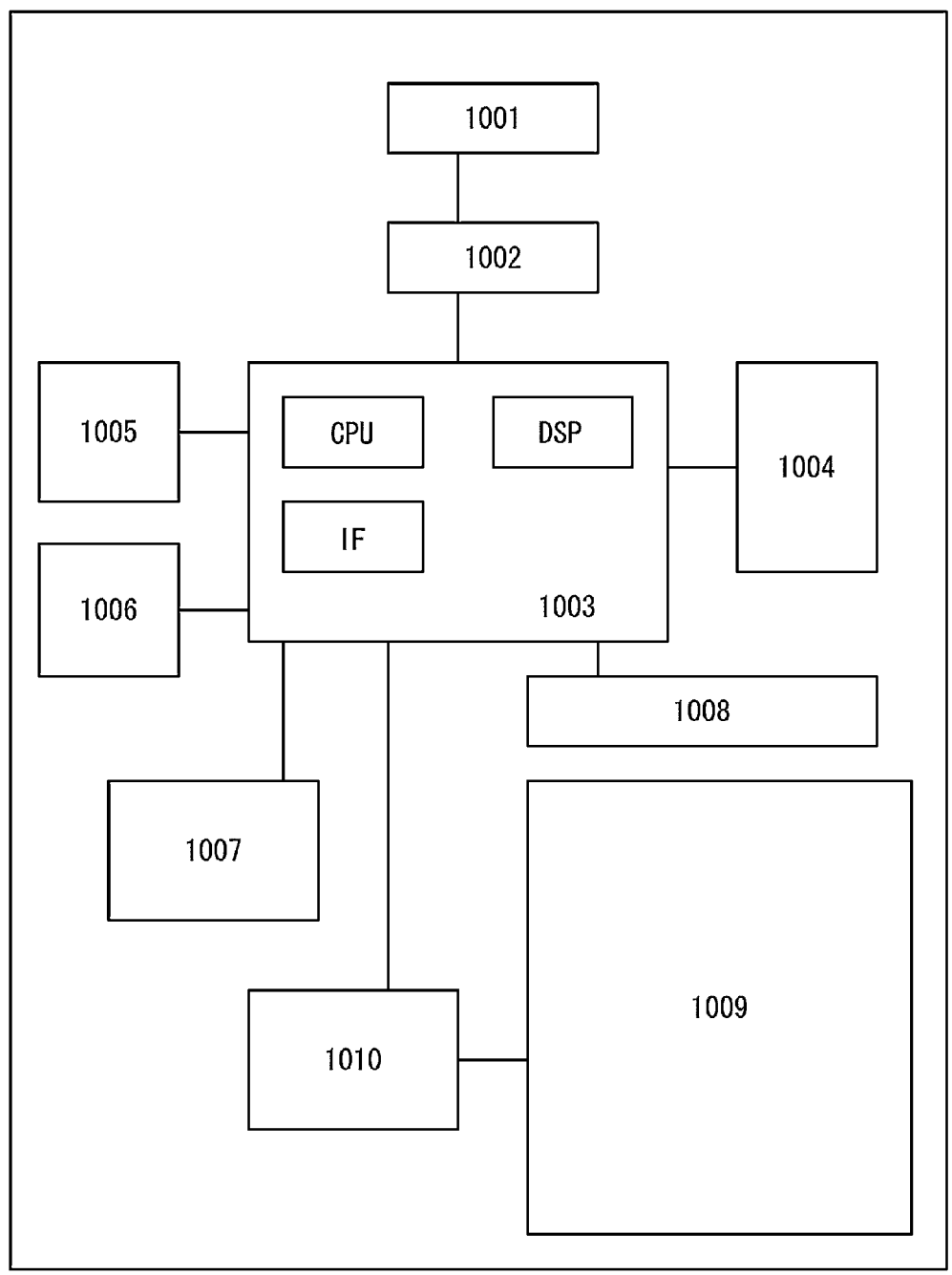
FIG. 17 is a diagram illustrating an example of a semiconductor device.

FIG. 17 is a block diagram of an e-book reader. The e-book reader in FIG. 17 includes a battery 1001, a power supply circuit 1002, a microprocessor 1003, a memory 1004 such as a flash memory, an audio circuit 1005, a keyboard 1006, a memory 1007, a touch panel 1008, a display 1009, and a display controller 1010.

Here, the semiconductor device described in Embodiment 3 or 4 can be used for the memory 1007 in FIG. 17. The memory 1007 has a function of temporarily holding the contents of a book. For example, users use a highlight function in some cases. In some cases, users put a mark on a letter while reading on an e-book reader. This marking refers to a highlight function, and users can make difference from other places by, for example, changing the color of a letter displayed, underlining a word, making a letter bold, or changing the font type of a letter. That is, there is a function of storing and holding information of a place specified by users. In the case where the information is stored for a long time, the information may be copied to the memory 1004. Even in such a case, by employing the semiconductor device described in Embodiment 3 or 4, writing and reading of data can be performed at high speed, stored data can be held for a long time, and power consumption can be sufficiently reduced.

As described above, the portable devices described in this embodiment each incorporate the semiconductor device according to Embodiment 3 or 4. Therefore, a portable device in which writing and reading of data are performed at high speed, data is held for a long time, and power consumption is sufficiently reduced, can be obtained.

This application is based on Japanese Patent Application serial No. 2011-223228 filed with Japan Patent Office on Oct. 7, 2011, the entire contents of which are hereby incorporated by reference.

What is claimed is:

1. A semiconductor device comprising:
   a substrate;
   an oxide semiconductor film over the substrate, the oxide semiconductor film comprising a crystal;
   a first electrode layer and a second electrode layer over the substrate;
   a gate insulating layer over the oxide semiconductor film, the first electrode layer, and the second electrode layer; and
   a gate electrode layer over the gate insulating layer,
   wherein a top surface of the oxide semiconductor film is aligned with a top surface of the first electrode layer and a top surface of the second electrode layer, wherein a general formula of the crystal is expressed by:
$In_xGe_{(1-x/2)(1-y)}Sn_{(1-x/2)y}Zn_{1-x/2}O_3(ZnO)_n$,
wherein x is a number greater than 0 and smaller than 2,
wherein y is a number greater than or equal to 0 and smaller than 1, and
wherein n is a number greater than or equal to 1.

2. The semiconductor device according to claim 1,
wherein the crystal comprises a first layer, a second layer over the first layer, and a third layer over the second layer,
wherein the first layer comprises an indium oxide,
wherein the second layer comprises a zinc oxide, and
wherein the third layer comprises a germanium-tin-zinc oxide.

3. The semiconductor device according to claim 2,
wherein the crystal comprises a fourth layer over the third layer, a fifth layer over the fourth layer, and a sixth layer over the fifth layer,
wherein the fourth layer comprises an indium oxide,
wherein the fifth layer comprises a zinc oxide, and
wherein the sixth layer comprises a germanium-tin-zinc oxide.

4. The semiconductor device according to claim 2,
wherein the crystal comprises a fourth layer over the third layer, a fifth layer over the fourth layer, a sixth layer over the fifth layer, a seventh layer over the sixth layer, and an eighth layer over the seventh layer,
wherein the fourth layer comprises a zinc oxide,
wherein the fifth layer comprises an indium oxide,
wherein the sixth layer comprises a zinc oxide,
wherein the seventh layer comprises a germanium-tin-zinc oxide, and
wherein the eighth layer comprises a zinc oxide.

5. The semiconductor device according to claim 1, further comprising a first conductive sidewall layer and a second conductive sidewall layer,
wherein a first side surface of the oxide semiconductor film is in contact with the first electrode layer,
wherein a second side surface of the oxide semiconductor film is in contact with the second electrode layer,
wherein a first side surface of the gate electrode layer is in contact with the first conductive sidewall layer,
wherein a second side surface of the gate electrode layer is in contact with the second conductive sidewall layer,
wherein the first conductive sidewall layer overlaps with the first electrode layer with the gate insulating layer provided therebetween, and
wherein the second conductive sidewall layer overlaps with the second electrode layer with the gate insulating layer provided therebetween.

6. The semiconductor device according to claim 1,
wherein the crystal comprises a first layer, a second layer over the first layer, and a third layer over the second layer,
wherein the first layer comprises an indium oxide,
wherein the second layer comprises at least one of a zinc oxide, a germanium- zinc oxide, a tin-zinc oxide, and a germanium-tin-zinc oxide, and
wherein the third layer comprises at least one of a zinc oxide, a germanium-zinc oxide, a tin-zinc oxide, and a germanium-tin-zinc oxide.

7. The semiconductor device according to claim 6,
wherein the crystal comprises a fourth layer over the third layer, a fifth layer over the fourth layer, and a sixth layer over the fifth layer,
wherein the fourth layer comprises an indium oxide,
wherein the fifth layer comprises at least one of a zinc oxide, a germanium-zinc oxide, a tin-zinc oxide, and a germanium-tin-zinc oxide, and
wherein the sixth layer comprises at least one of a zinc oxide, a germanium-zinc oxide, a tin-zinc oxide, and a germanium-tin-zinc oxide.

8. The semiconductor device according to claim 6,
wherein the crystal comprises a fourth layer over the third layer, a fifth layer over the fourth layer, a sixth layer over the fifth layer, a seventh layer over the sixth layer, and an eighth layer over the seventh layer,
wherein the fourth layer comprises at least one of a zinc oxide, a germanium-zinc oxide, a tin-zinc oxide, and a germanium-tin-zinc oxide,
wherein the fifth layer comprises an indium oxide,
wherein the sixth layer comprises at least one of a zinc oxide, a germanium-zinc oxide, a tin-zinc oxide, and a germanium-tin-zinc oxide,
wherein the seventh layer comprises at least one of a zinc oxide, a germanium- zinc oxide, a tin-zinc oxide, and a germanium-tin-zinc oxide, and
wherein the eighth layer comprises at least one of a zinc oxide, a germanium- zinc oxide, a tin-zinc oxide, and a germanium-tin-zinc oxide.

9. A semiconductor device comprising:
a substrate;
an oxide semiconductor film over the substrate, the oxide semiconductor film comprising a crystal;
a first electrode layer and a second electrode layer over the substrate;
a gate insulating layer over the oxide semiconductor film, the first electrode layer, and the second electrode layer; and
a gate electrode layer over the gate insulating layer,
wherein a top surface of the oxide semiconductor film is aligned with a top surface of the first electrode layer and a top surface of the second electrode layer,
wherein a general formula of the crystal is expressed by:
$In_{x(1-y)}Ga_{xy}Ge_{1-x/2}Zn_{1-x/2}O_3(ZnO)_n$,
wherein x is a number greater than 0 and smaller than 2,
wherein y is a number greater than or equal to 0 and smaller than 1, and
wherein n is a number greater than or equal to 1.

10. The semiconductor device according to claim 9,
wherein the crystal comprises a first layer, a second layer over the first layer, and a third layer over the second layer,
wherein the first layer comprises an indium oxide,
wherein the second layer comprises a zinc oxide, and
wherein the third layer comprises a germanium-zinc oxide.

11. The semiconductor device according to claim 10,
wherein the crystal comprises a fourth layer over the third layer, a fifth layer over the fourth layer, and a sixth layer over the fifth layer,
wherein the fourth layer comprises an indium oxide,
wherein the fifth layer comprises a zinc oxide, and
wherein the sixth layer comprises a gallium-zinc oxide.

12. The semiconductor device according to claim 11,
wherein the crystal comprises a seventh layer over the sixth layer, an eighth layer over the seventh layer, and a ninth layer over the eighth layer,
wherein the seventh layer comprises an indium oxide,
wherein the eighth layer comprises a zinc oxide, and
wherein the ninth layer comprises a gallium-germanium oxide.

13. The semiconductor device according to claim 9, further comprising a first conductive sidewall layer and a second conductive sidewall layer,
wherein a first side surface of the oxide semiconductor film is in contact with the first electrode layer,
wherein a second side surface of the oxide semiconductor film is in contact with the second electrode layer,
wherein a first side surface of the gate electrode layer is in contact with the first conductive sidewall layer,
wherein a second side surface of the gate electrode layer is in contact with the second conductive sidewall layer,
wherein the first conductive sidewall layer overlaps with the first electrode layer with the gate insulating layer provided therebetween, and
wherein the second conductive sidewall layer overlaps with the second electrode layer with the gate insulating layer provided therebetween.

14. The semiconductor device according to claim 9,
wherein the crystal comprises a first layer, a second layer over the first layer, and a third layer over the second layer,
wherein the first layer comprises an indium oxide,
wherein the second layer comprises at least one of a zinc oxide, a gallium-zinc oxide, a germanium-zinc oxide, and a gallium-germanium-zinc oxide, and
wherein the third layer comprises at least one of a zinc oxide, a gallium-zinc oxide, a germanium-zinc oxide, and a gallium-germanium-zinc oxide.

15. The semiconductor device according to claim 14,
wherein the crystal comprises a fourth layer over the third layer, a fifth layer over the fourth layer, and a sixth layer over the fifth layer,
wherein the fourth layer comprises an indium oxide,
wherein the fifth layer comprises at least one of a zinc oxide, a gallium-zinc oxide, a germanium-zinc oxide, and a gallium-germanium-zinc oxide, and
wherein the sixth layer comprises at least one of a zinc oxide, a gallium-zinc oxide, a germanium-zinc oxide, and a gallium-germanium-zinc oxide.

16. The semiconductor device according to claim 15,
wherein the crystal comprises a seventh layer over the sixth layer, an eighth layer over the seventh layer, and a ninth layer over the seventh layer,
wherein the seventh layer comprises an indium oxide,
wherein the eighth layer comprises at least one of a zinc oxide, a gallium-zinc oxide, a germanium-zinc oxide, and a gallium-germanium-zinc oxide, and
wherein the ninth layer comprises at least one of a gallium oxide, a germanium oxide, a gallium-germanium oxide, and a gallium-germanium-zinc oxide.

17. A semiconductor device comprising:
a substrate;
an oxide semiconductor film over the substrate, the oxide semiconductor film comprising a crystal;
a first electrode layer and a second electrode layer over the substrate;
a gate insulating layer over the oxide semiconductor film, the first electrode layer, and the second electrode layer; and
a gate electrode layer over the gate insulating layer,
wherein a top surface of the oxide semiconductor film is aligned with a top surface of the first electrode layer and a top surface of the second electrode layer,
wherein a general formula of the crystal is expressed by: $In_xGe_{1-x/2}Zn_{1-x/2}O_3(ZnO)_n$,
wherein x is a number greater than 0 and smaller than 2, and
wherein n is a number greater than or equal to 1.

18. The semiconductor device according to claim 17,
wherein the crystal comprises a first layer, a second layer over the first layer, and a third layer over the second layer,
wherein the first layer comprises an indium oxide,
wherein the second layer comprises a zinc oxide, and
wherein the third layer comprises a germanium-zinc oxide.

19. The semiconductor device according to claim 18,
wherein the crystal comprises a fourth layer over the third layer, a fifth layer over the fourth layer, and a sixth layer over the fifth layer,
wherein the fourth layer comprises an indium oxide,
wherein the fifth layer comprises a zinc oxide, and
wherein the sixth layer comprises a germanium-zinc oxide.

20. The semiconductor device according to claim 19,
wherein the crystal comprises a seventh layer over the sixth layer, an eighth layer over the seventh layer, and a ninth layer over the eighth layer,
wherein the fifth layer comprises an indium oxide,
wherein the sixth layer comprises a zinc oxide, and
wherein the seventh layer comprises a germanium-zinc oxide.

21. The semiconductor device according to claim 17, further comprising a transistor, an insulating layer over the transistor, a first conductive sidewall layer, and a second conductive sidewall layer,
wherein a first side surface of the oxide semiconductor film is in contact with the first electrode layer,
wherein a second side surface of the oxide semiconductor film is in contact with the second electrode layer,
wherein a first side surface of the gate electrode layer is in contact with the first conductive sidewall layer,
wherein a second side surface of the gate electrode layer is in contact with the second conductive sidewall layer,
wherein the first conductive sidewall layer overlaps with the first electrode layer with the gate insulating layer provided therebetween,
wherein the second conductive sidewall layer overlaps with the second electrode layer with the gate insulating layer provided therebetween,
wherein the transistor comprises a semiconductor layer, a second gate insulating layer over the semiconductor layer, and a second gate electrode layer over the second gate insulating layer,
wherein the oxide semiconductor film, the first electrode layer, and the second electrode layer are over the insulating layer, and
wherein the first electrode layer is in contact with the second gate electrode layer.

22. The semiconductor device according to claim 17,
wherein the crystal comprises a first layer, a second layer over the first layer, and a third layer over the second layer,
wherein the first layer comprises an indium oxide,
wherein the second layer comprises at least one of a zinc oxide and a germanium-zinc oxide, and
wherein the third layer comprises at least one of a zinc oxide and a germanium- zinc oxide.

23. The semiconductor device according to claim 22,
wherein the crystal comprises a fourth layer over the third layer, a fifth layer over the fourth layer, and a sixth layer over the fifth layer,
wherein the fourth layer comprises an indium oxide,
wherein the fifth layer comprises at least one of a zinc oxide and a germanium- zinc oxide, and
wherein the sixth layer comprises at least one of a zinc oxide and a germanium- zinc oxide.

24. The semiconductor device according to claim 23,
wherein the crystal comprises a seventh layer over the sixth layer, an eighth layer over the seventh layer, and a ninth layer over the eighth layer,
wherein the fifth layer comprises an indium oxide,
wherein the sixth layer comprises at least one of a zinc oxide and a germanium- zinc oxide, and
wherein the seventh layer comprises at least one of a zinc oxide and a germanium-zinc oxide.

* * * * *